US012527032B2

(12) United States Patent
Li et al.

(10) Patent No.: US 12,527,032 B2
(45) Date of Patent: Jan. 13, 2026

(54) BACKSIDE CONTACT WITH SHALLOW PLACEHOLDER AND EASY BACKSIDE SEMICONDUCTOR REMOVAL

(71) Applicant: International Business Machines Corporation, Armonk, NY (US)

(72) Inventors: Tao Li, Slingerlands, NY (US); Shogo Mochizuki, Mechanicville, NY (US); Kisik Choi, Watervliet, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 579 days.

(21) Appl. No.: 17/956,918

(22) Filed: Sep. 30, 2022

(65) Prior Publication Data
US 2024/0113193 A1   Apr. 4, 2024

(51) Int. Cl.
| | |
|---|---|
| *H10D 30/67* | (2025.01) |
| *H01L 23/528* | (2006.01) |
| *H10D 62/10* | (2025.01) |
| *H10D 84/01* | (2025.01) |
| *H10D 84/03* | (2025.01) |

(52) U.S. Cl.
CPC ..... *H10D 30/6735* (2025.01); *H01L 23/5286* (2013.01); *H10D 30/6757* (2025.01); *H10D 62/121* (2025.01); *H10D 84/013* (2025.01); *H10D 84/038* (2025.01)

(58) Field of Classification Search
CPC .......... H10D 30/6735; H10D 30/6757; H10D 62/121; H10D 62/116; H10D 62/151; H10D 62/822; H10D 84/013; H10D 84/038; H10D 84/0149; H10D 84/017; H10D 84/0186; H10D 84/83; H10D 84/85; H01L 23/5286; H01L 21/76805; H01L 21/76897

USPC .......................................................... 257/347
See application file for complete search history.

(56) References Cited

U.S. PATENT DOCUMENTS

| | | |
|---|---|---|
| 9,209,305 B1 | 12/2015 | Zhang |
| 10,797,139 B2 | 10/2020 | Morrow |
| 11,222,892 B2 | 1/2022 | Su |
| 11,239,325 B2 | 2/2022 | Huang |
| 11,276,643 B2 | 3/2022 | Huang |
| 11,362,213 B2 | 6/2022 | Ju |

(Continued)

FOREIGN PATENT DOCUMENTS

| | | |
|---|---|---|
| CN | 111696957 A | 9/2020 |
| CN | 115084019 A | 9/2022 |

OTHER PUBLICATIONS

Authorized officer Chen,DongBing. China National Intellectual Property Administration. Counterpart PCT application PCT/CN2023/094809 ISR & WO. Jun. 23, 2023. pp. 8.

*Primary Examiner* — Duy T Nguyen
*Assistant Examiner* — Jiyoung Oh
(74) *Attorney, Agent, or Firm* — Seed Intellectual Property Law Group LLP

(57) ABSTRACT

A semiconductor structure includes a first source-drain region; a second source-drain region; at least one channel region coupling the first and second source-drain regions; and a gate adjacent the at least one channel region. A bottom dielectric isolation region is located inward of the gate. First and second bottom silicon regions are respectively located inward of the first and second source-drain regions. A back side contact projects through the second bottom silicon region into the second source-drain region.

17 Claims, 21 Drawing Sheets

(56) References Cited

U.S. PATENT DOCUMENTS

| | | | |
|---|---|---|---|
| 2019/0326405 A1* | 10/2019 | Morrow | H01L 21/02532 |
| 2020/0294998 A1* | 9/2020 | Lilak | H01L 23/535 |
| 2020/0312980 A1 | 10/2020 | Frougier | |
| 2021/0111115 A1 | 4/2021 | Morrow | |
| 2021/0134721 A1 | 5/2021 | Chiang | |
| 2021/0202385 A1* | 7/2021 | Huang | H10D 84/834 |
| 2021/0305252 A1 | 9/2021 | Chiang | |
| 2021/0305381 A1 | 9/2021 | Chiang | |
| 2021/0351303 A1 | 11/2021 | Ju | |
| 2021/0376071 A1 | 12/2021 | Liu | |
| 2021/0376093 A1 | 12/2021 | Chu | |
| 2022/0069117 A1 | 3/2022 | Yu | |
| 2022/0139911 A1 | 5/2022 | Wei | |
| 2022/0139914 A1 | 5/2022 | Cheng | |
| 2022/0359679 A1* | 11/2022 | Lu | H10D 64/01 |

* cited by examiner

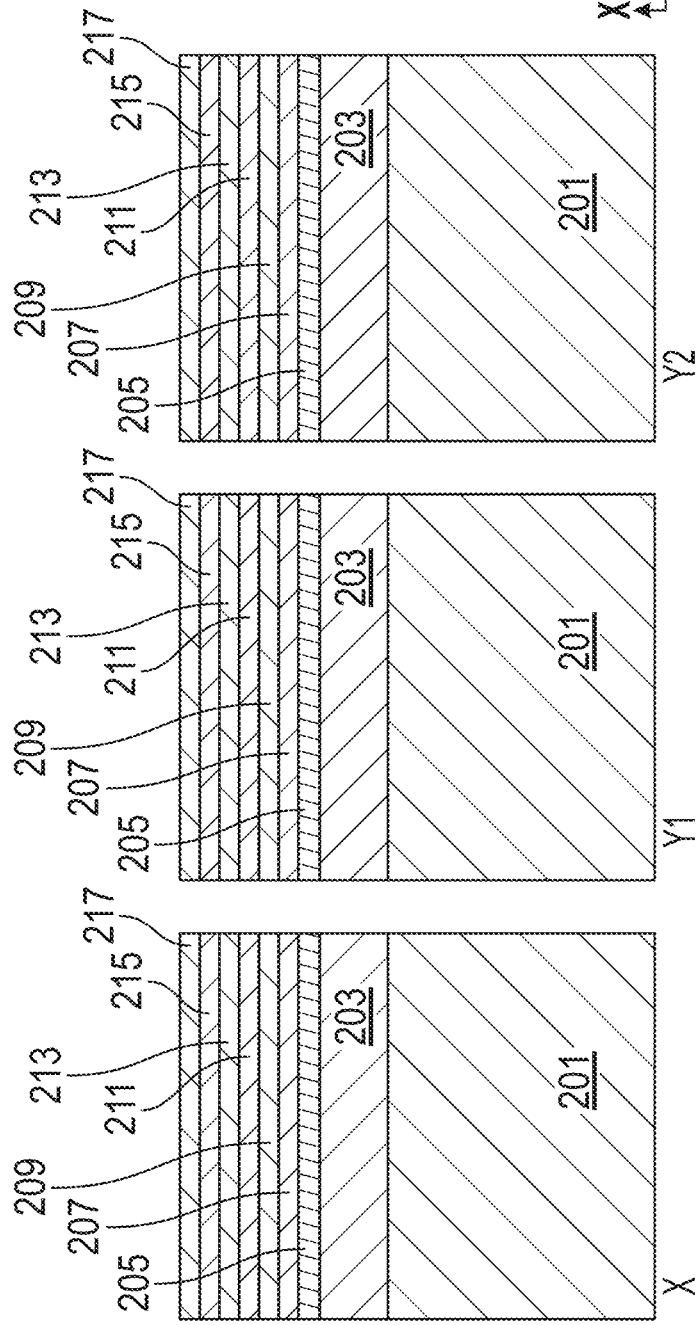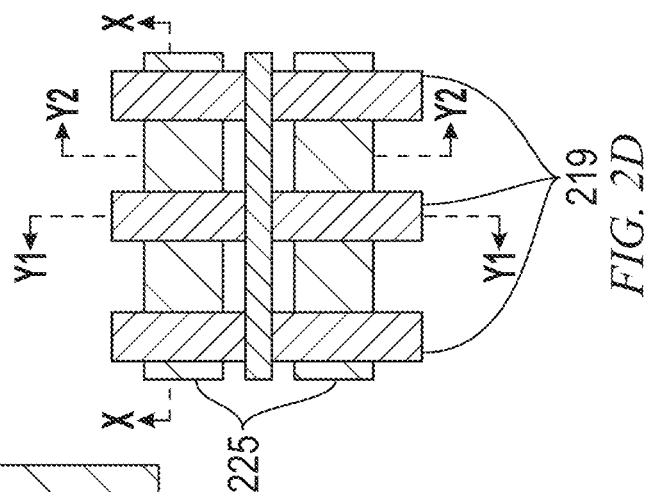

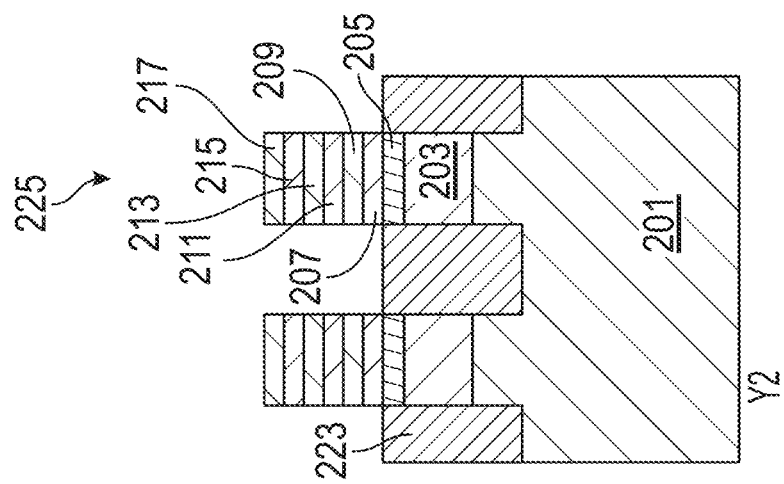
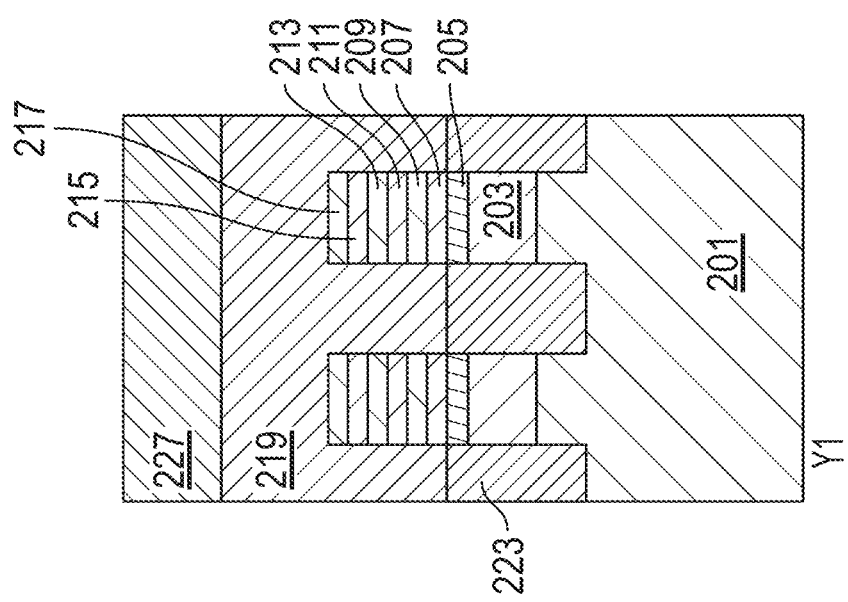
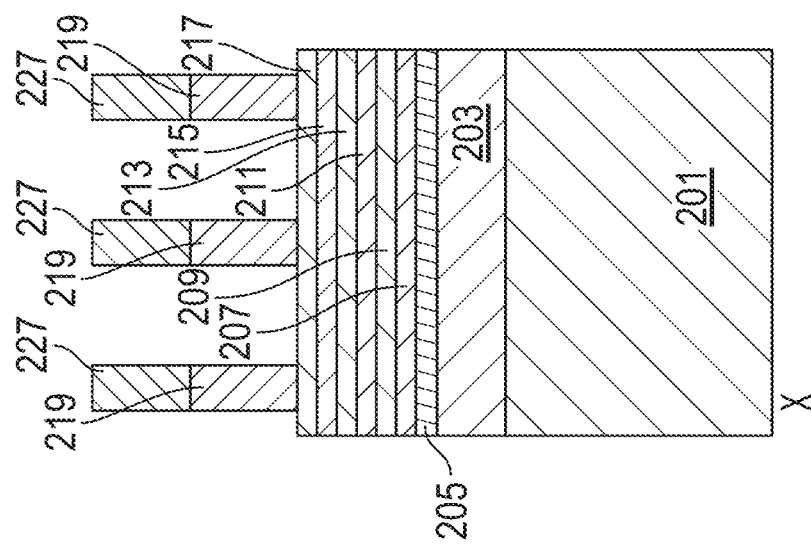

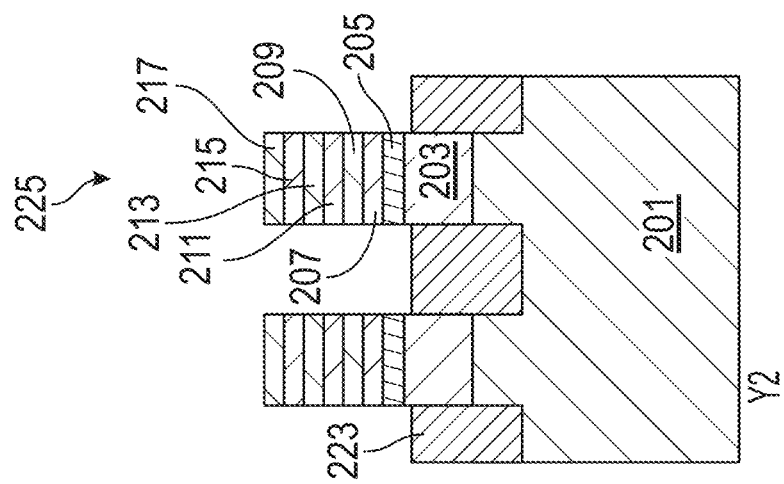
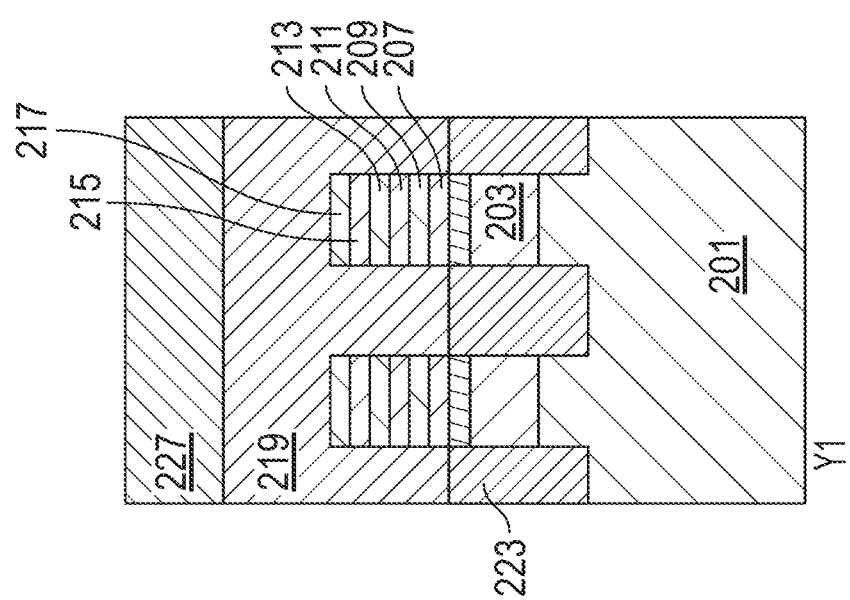
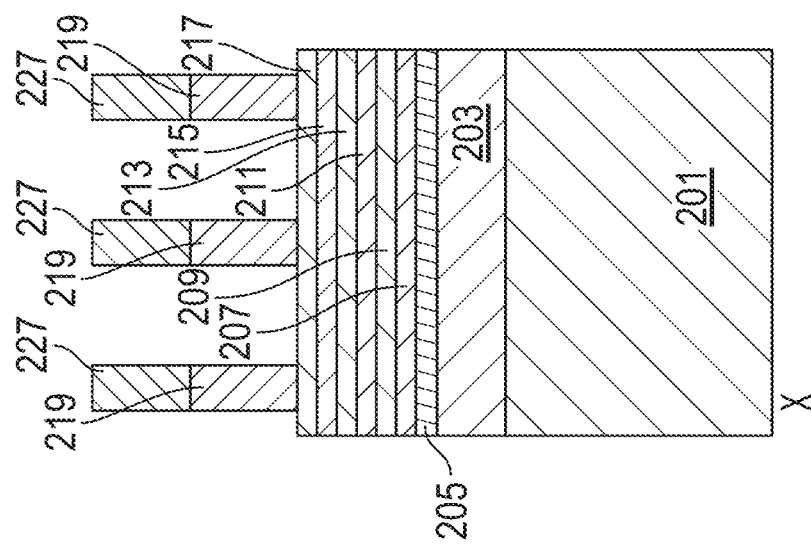

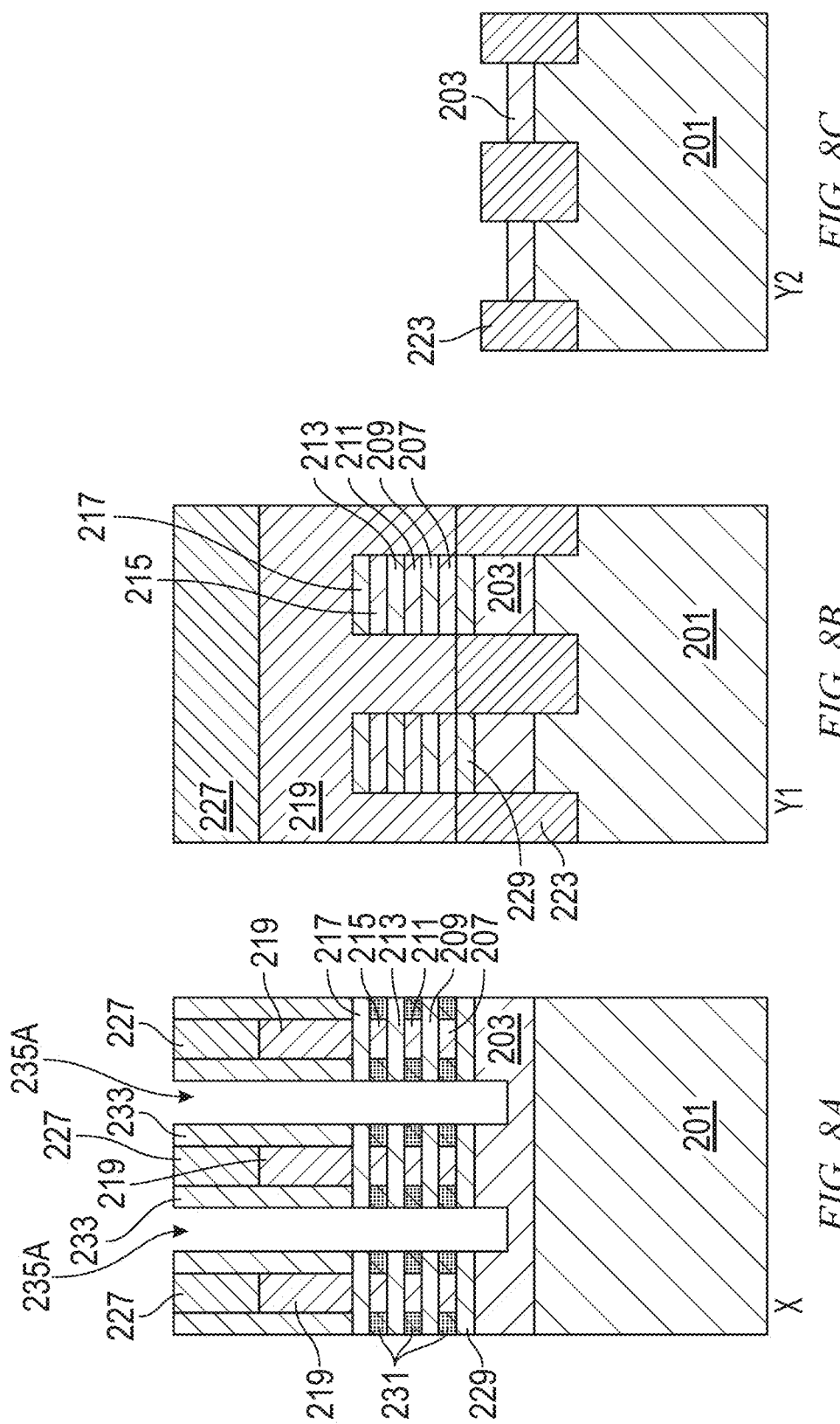

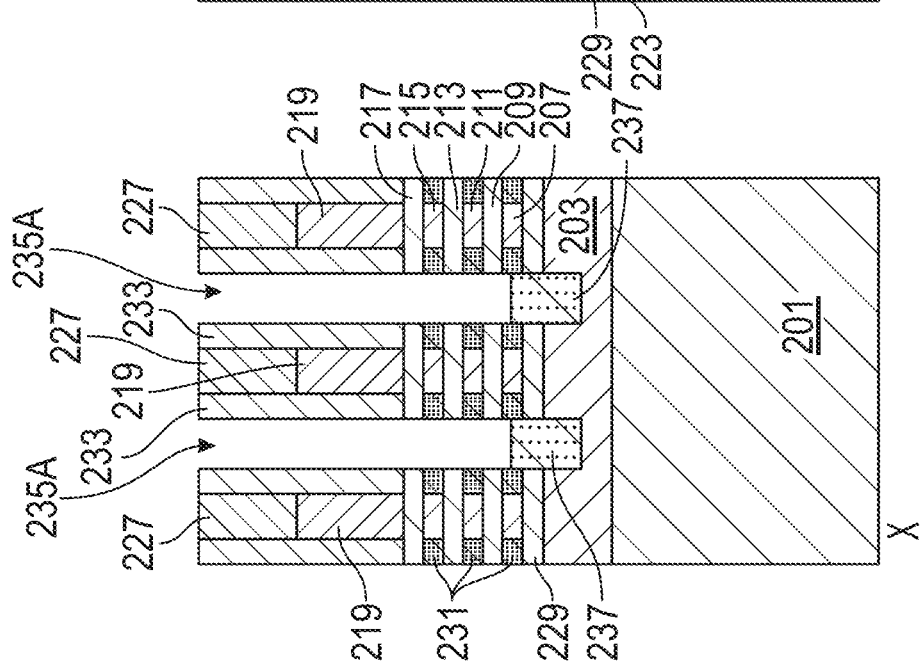
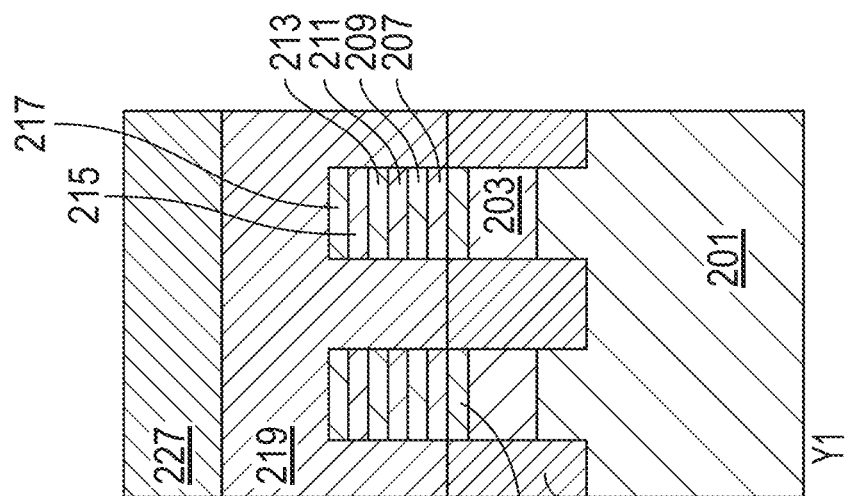
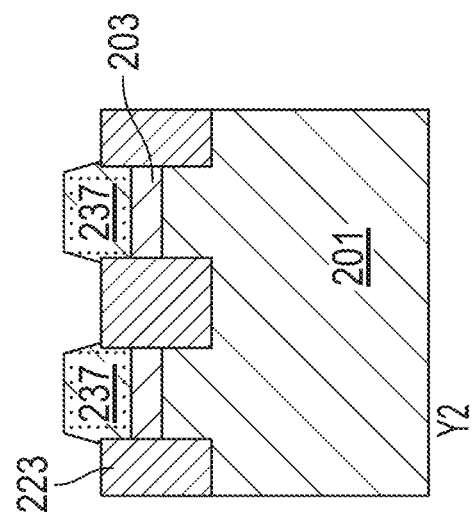
FIG. 9A
FIG. 9B
FIG. 9C

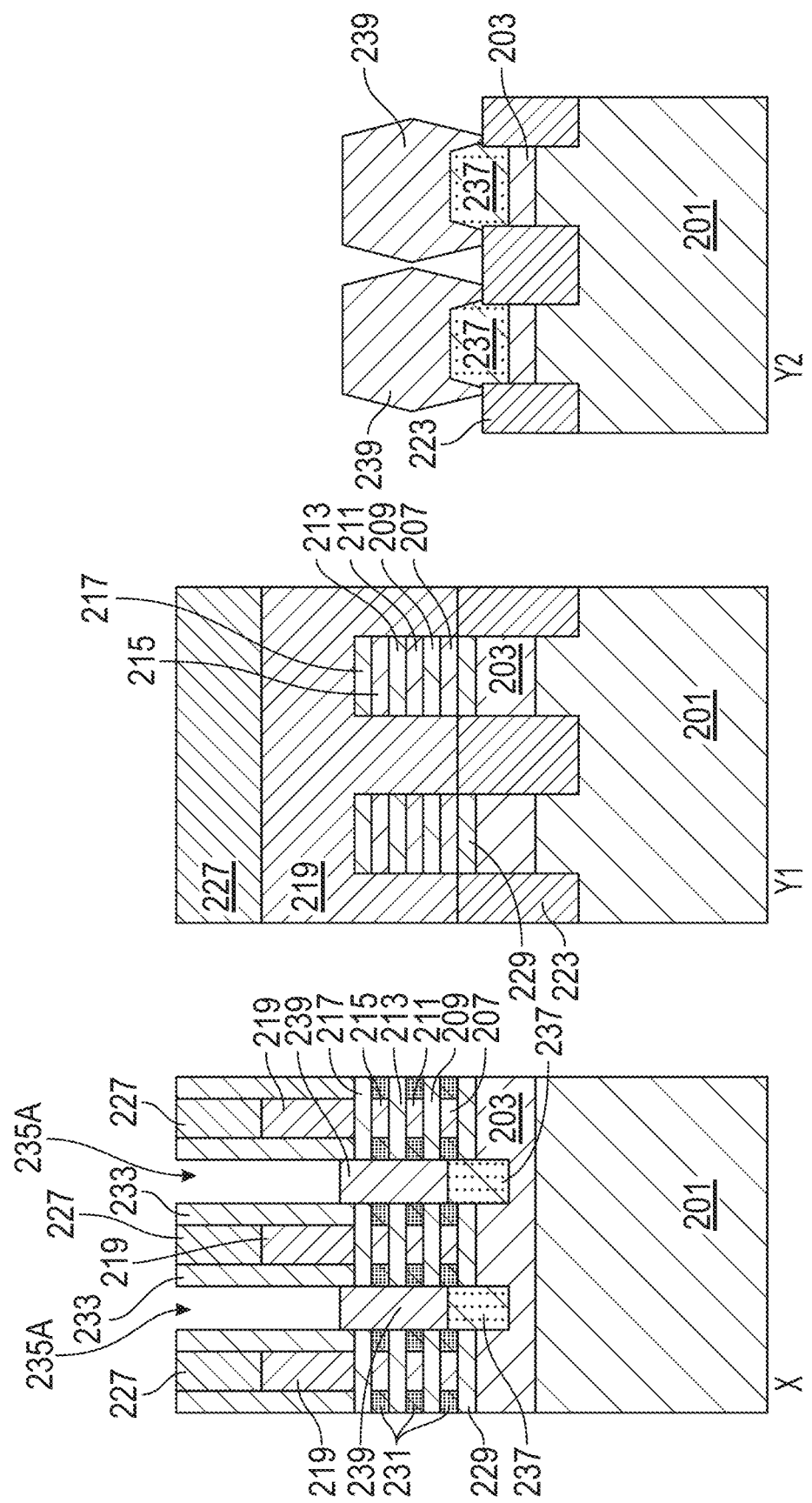

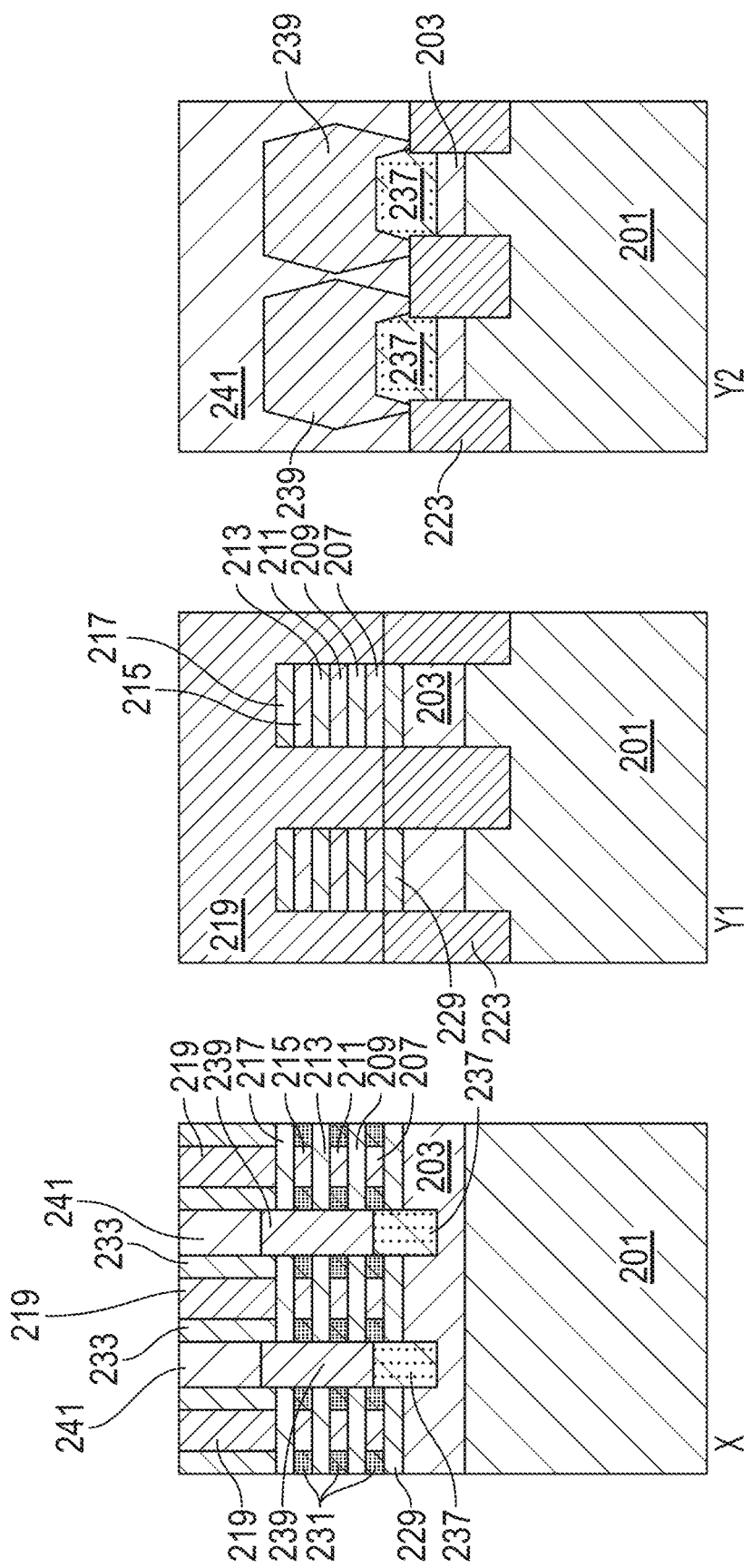

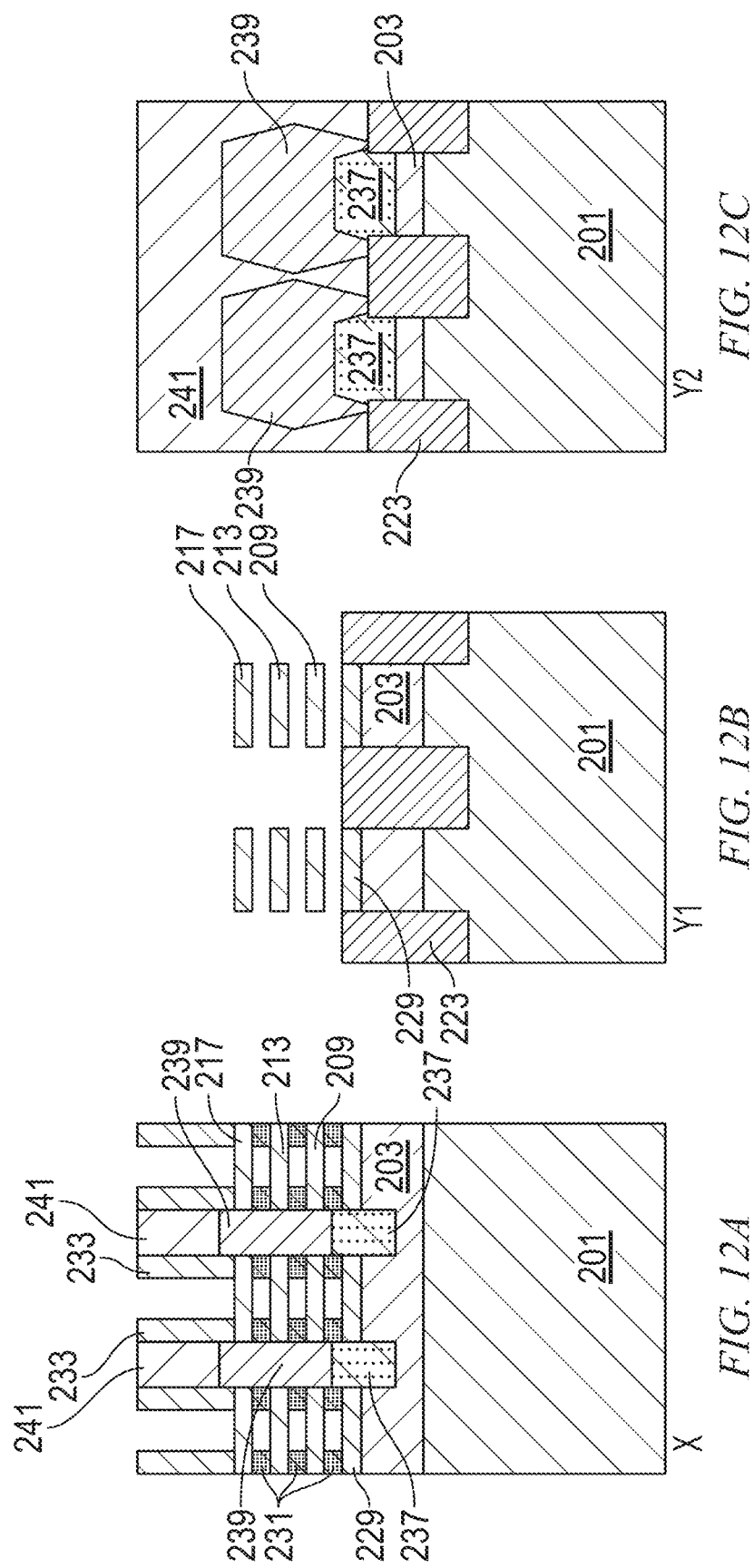

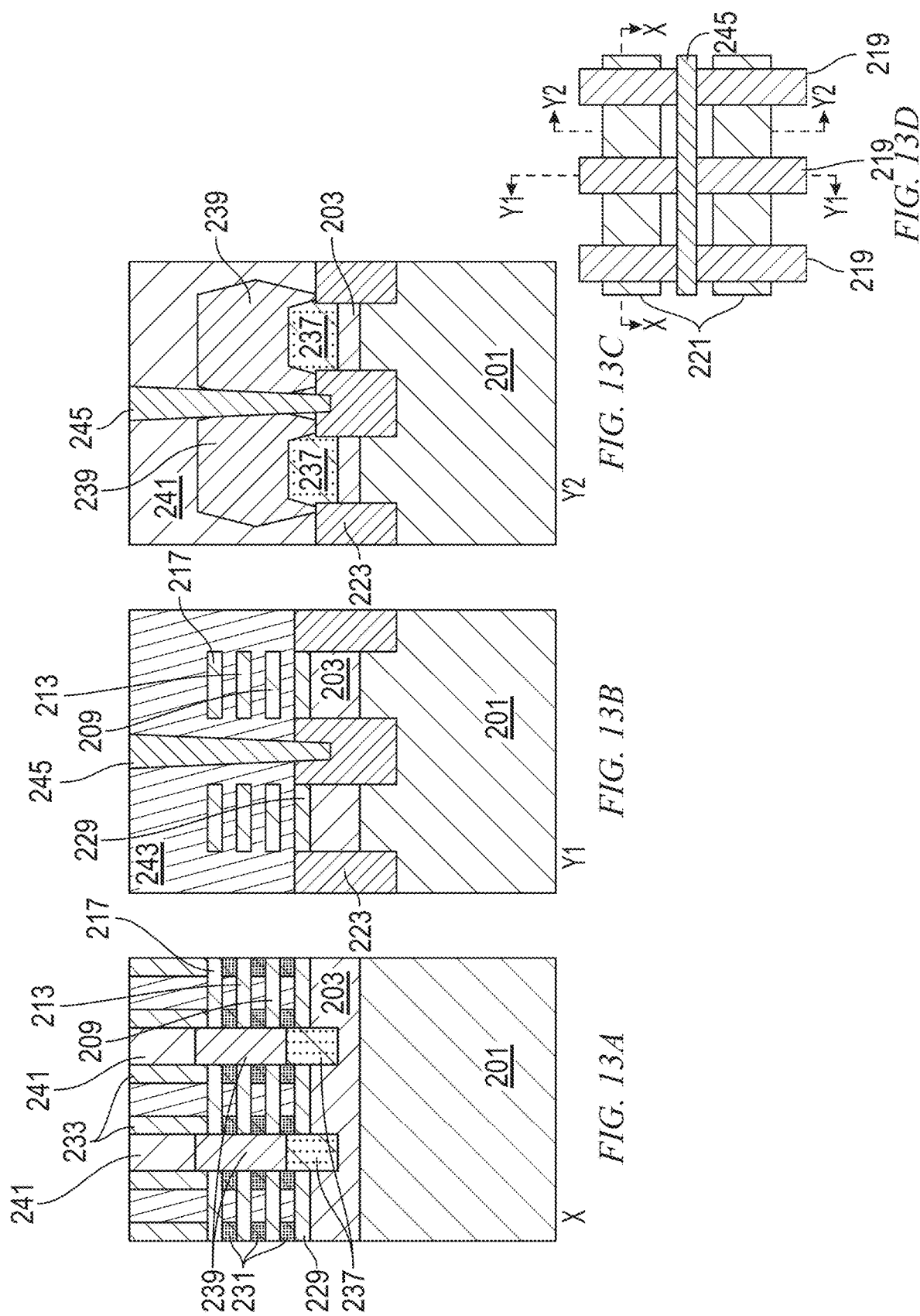

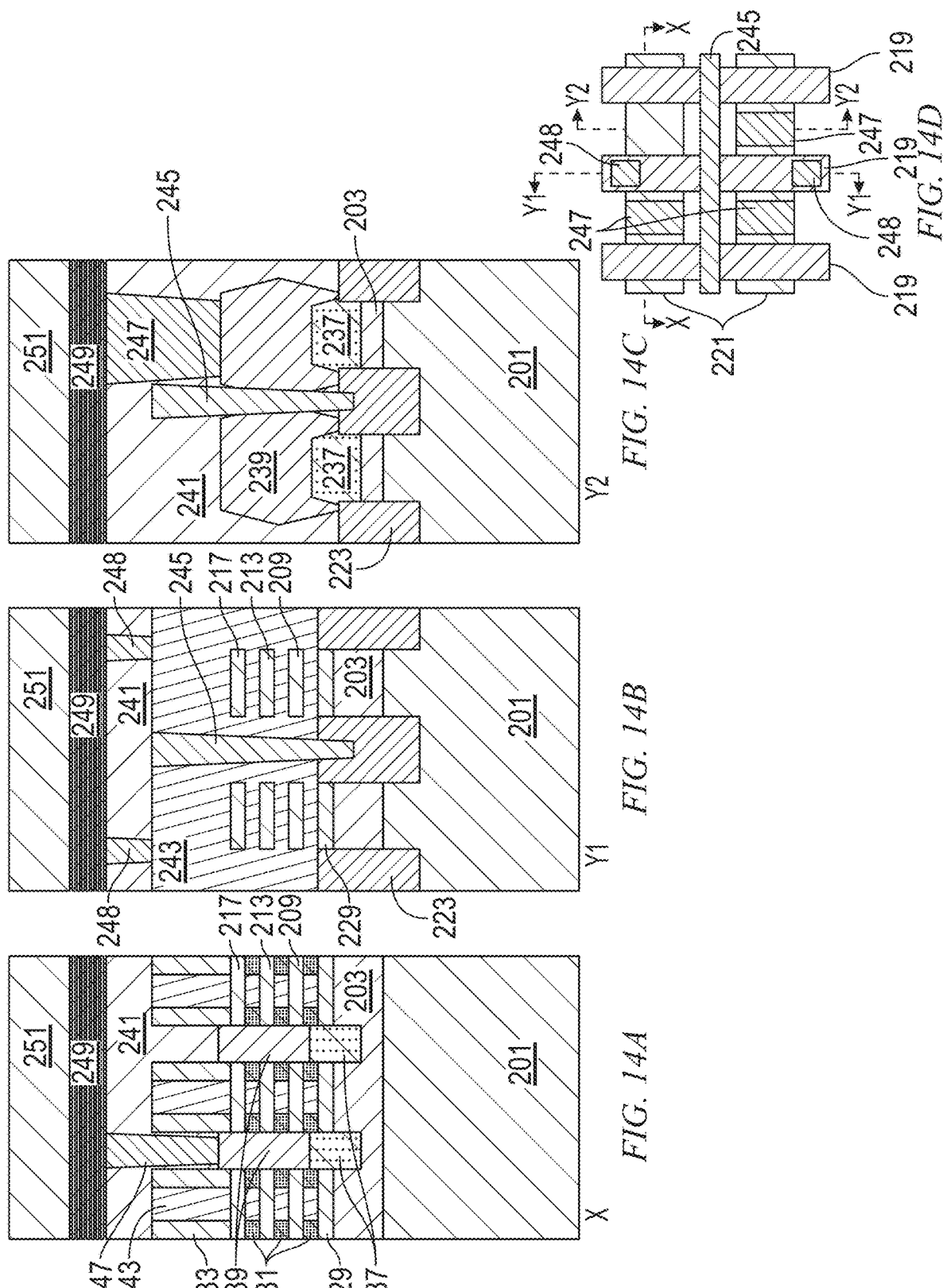

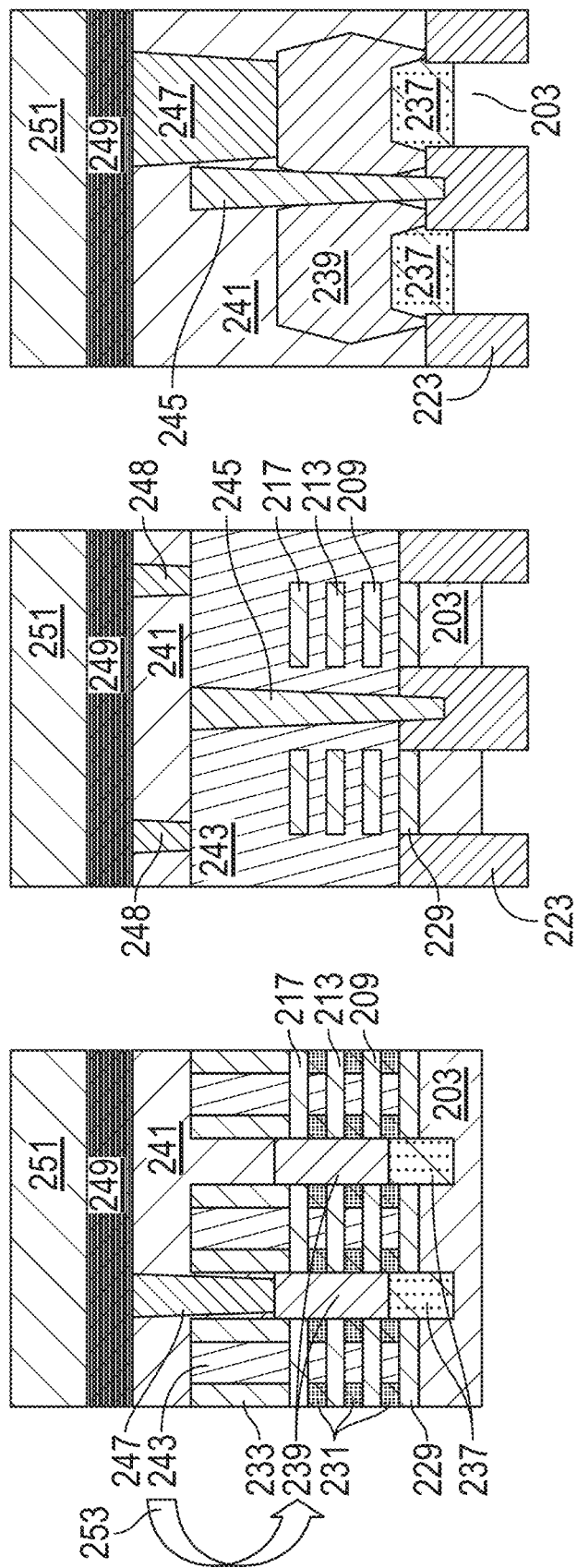

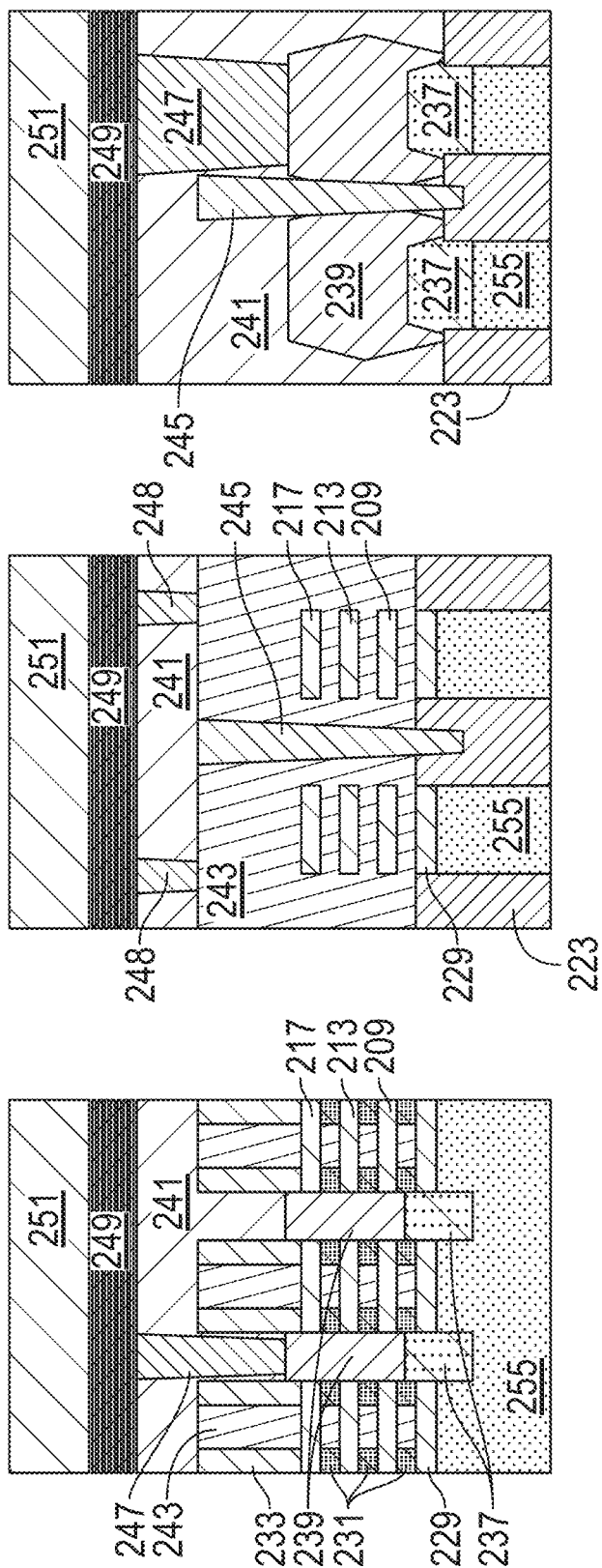

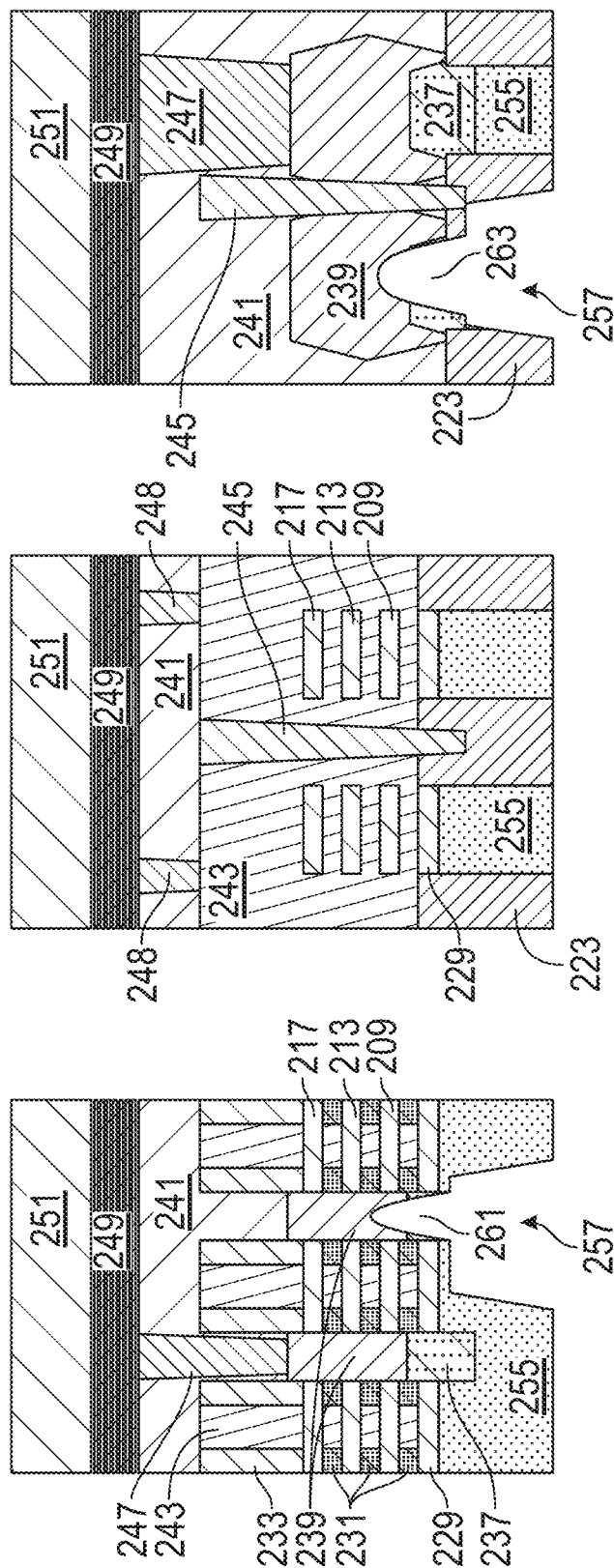

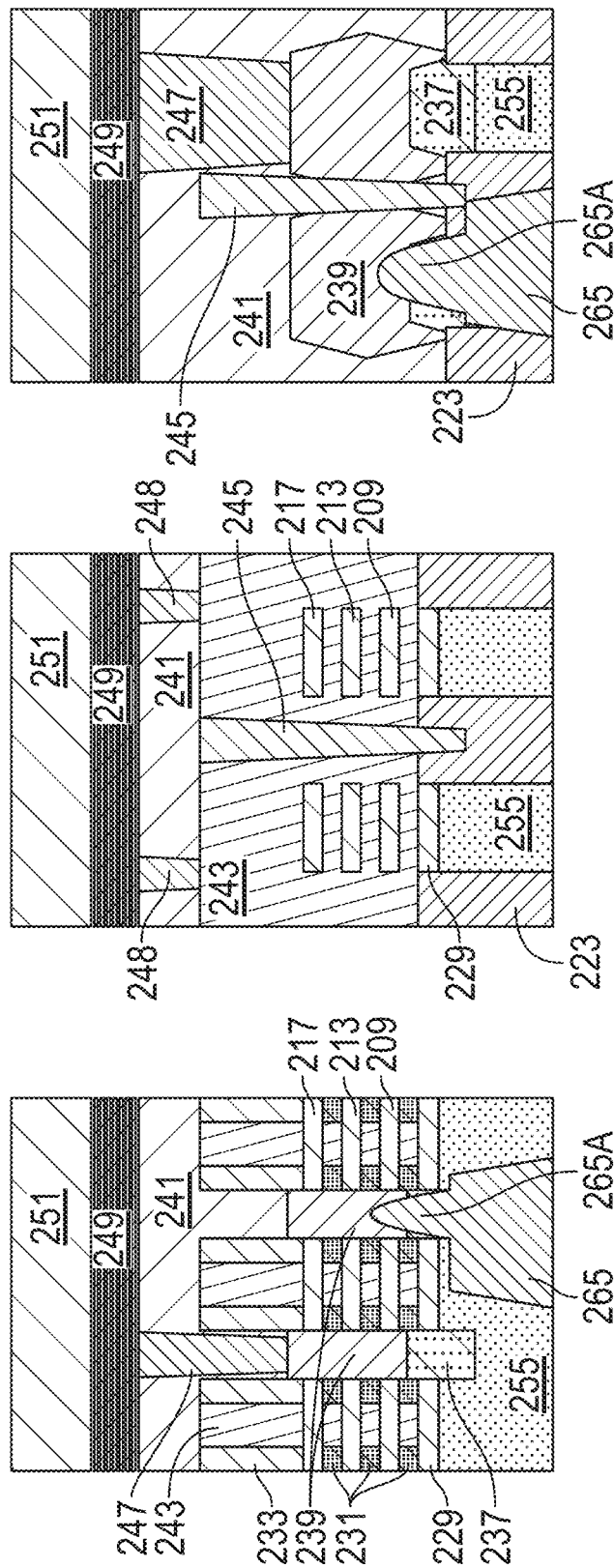

BACKSIDE CONTACT WITH SHALLOW PLACEHOLDER AND EASY BACKSIDE SEMICONDUCTOR REMOVAL

BACKGROUND

The present invention relates generally to the electrical, electronic and computer arts and, more particularly, to backside contacts for use with backside power distribution networks (BSPDNs).

A power delivery network provides power and reference voltage to the active devices on a semiconductor chip; this power delivery network is essentially a network of interconnects that is separate from the signal network. Heretofore, both power and signal networks have been fabricated through back-end-of-line (BEOL) processing on the front side of the wafer. More recently, BSPDNs have been developed, providing power from the back side of the wafer, and typically formed during wafer backside processing.

BRIEF SUMMARY

Principles of the invention provide techniques for a backside contact with a shallow placeholder and easy backside semiconductor removal. In one aspect, an exemplary semiconductor structure includes a first source-drain region; a second source-drain region; at least one channel region coupling the first and second source-drain regions; a gate adjacent the at least one channel region; a bottom dielectric isolation region inward of the gate; first and second bottom silicon regions respectively located inward of the first and second source-drain regions; and a back side contact projecting through the second bottom silicon region into the second source-drain region.

In another aspect, an exemplary semiconductor array structure includes a plurality of field effect transistors, each comprising a first source-drain region, a second source-drain region, at least one channel region coupling the first and second source-drain regions, a gate adjacent the at least one channel, a bottom dielectric isolation region inward of the gate, and first and second bottom silicon regions respectively located inward of the first and second source-drain regions. Also included are a back side power distribution network; a front side wiring network; a plurality of contacts interconnecting the front side wiring network and the plurality of first source-drain regions; and a plurality of back side contacts, each projecting through a corresponding one of the second bottom silicon regions into a corresponding one of the second source-drain regions, each connected to the back side power distribution network.

In still another aspect, an exemplary method of forming a semiconductor structure includes providing a precursor structure comprising a nanosheet stack outward of a high SiGe epitaxially grown layer and a low SiGe epitaxially grown layer on an underlying substrate; removing the high SiGe layer and forming bottom dielectric isolation (BDI) in a region vacated by the high SiGe layer; forming two sacrificial placeholders at least partially within the low SiGe epitaxially grown layer and forming source-drain regions outward of the two sacrificial placeholders; and forming middle of line (MOL) and back end of line (BEOL) structures outward of the precursor structure and bonding a carrier wafer outward of the (BEOL) structures. The method further includes flipping the carrier wafer, and removing the substrate, stopping on the low SiGe layer; removing the low SiGe layer selective to the BDI and sacrificial placeholder; forming backside inter-layer dielectric (ILD) inward of the BDI; forming a backside contact opening in at least the backside ILD to reveal one of the sacrificial placeholders; and forming the backside contact within the backside contact opening.

As used herein, "facilitating" an action includes performing the action, making the action easier, helping to carry the action out, or causing the action to be performed. Thus, by way of example and not limitation, instructions executing on a processor might facilitate an action carried out by semiconductor fabrication equipment, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects. Some embodiments may not have these potential advantages and these potential advantages are not necessarily required of all embodiments. By way of example only and without limitation, one or more embodiments may provide one or more of:

- ability to form a relatively large backside contact without shorting;
- backside contact can be formed without need for difficult deep reactive ion etching processes;
- includes a backside dielectric insulator layer to reduce sub-channel leakage and/or increase power performance of a field effect transistor;
- easier removal of substrate from the backside;
- source/drain (S/D) epitaxial growth is easier from a shallow Si placeholder since now S/D epitaxy grows not only from Si nanosheets, but also grows from the Si placeholder top surface.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIGS. 2A, 2B, and 2C are cross-sectional views of a precursor for fabricating the semiconductor structure, taken along lines X, Y1, and Y2 respectively, in FIG. 2D, according to an aspect of the invention;

FIGS. 3A-12C show exemplary subsequent steps for fabricating the semiconductor structure, the "A," "B," and "C" views being taken along lines X, Y1, and Y2 in FIG. 2D, respectively, according to aspects of the invention;

FIGS. 13A-13C show an exemplary subsequent step for fabricating the semiconductor structure, the "A," "B," and "C" views being taken along lines X, Y1, and Y2 in FIG. 13D, respectively, according to aspects of the invention;

FIGS. 14A-20C show exemplary subsequent steps for fabricating the semiconductor structure, the "A," "B," and "C" views being taken along lines X, Y1, and Y2 in FIG. 14D, respectively, according to aspects of the invention.

Figures 1A, 1B, 1C:
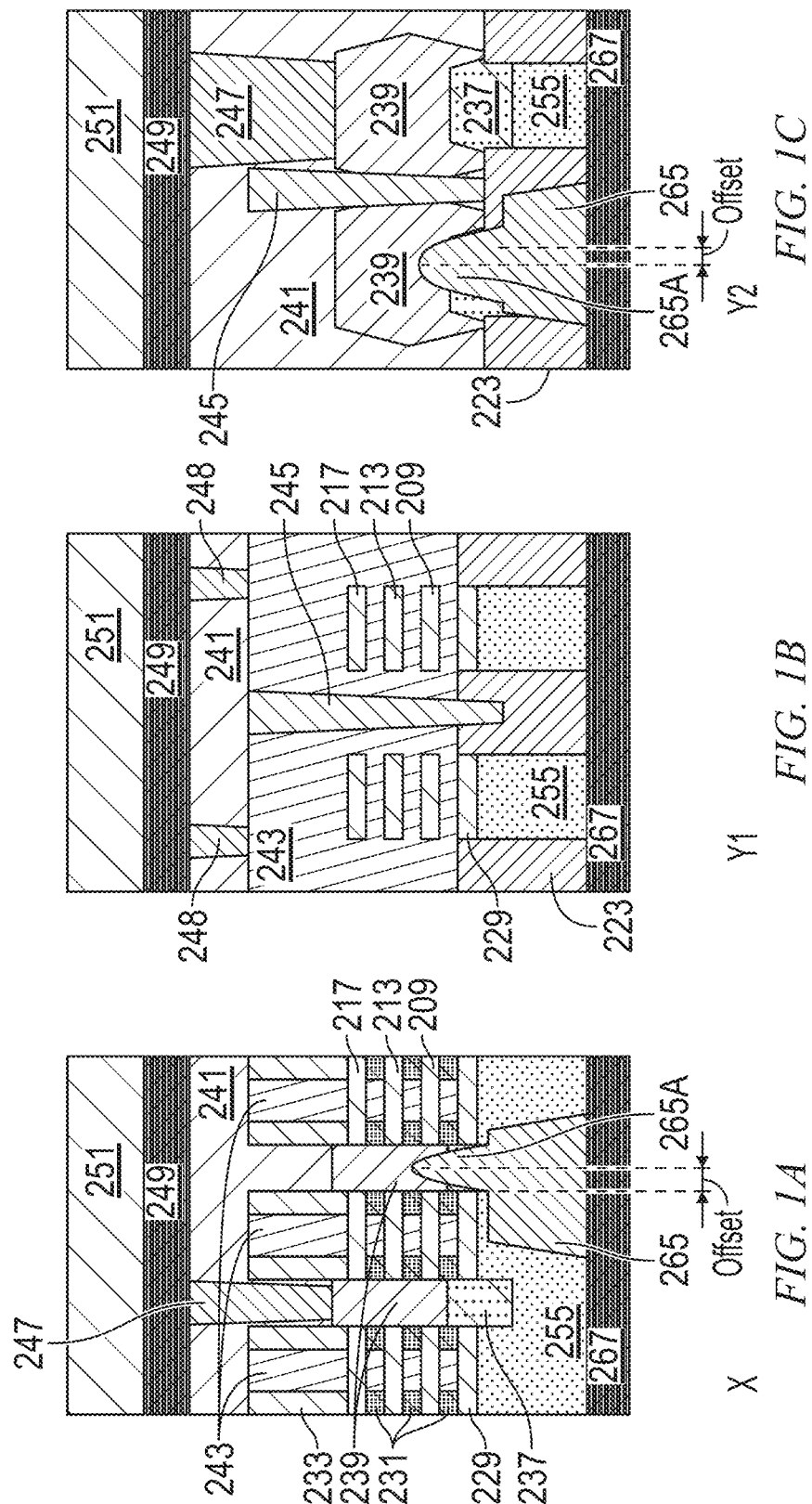
FIGS. 1A, 1B, and 1C are cross-sectional views of a semiconductor structure, taken along lines X, Y1, and Y2 respectively, in FIG. 14D, according to an aspect of the invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

In modern semiconductor structures, a self-aligned backside contact is desirable to mitigate poor overlay margin at the wafer backside. However, a self-aligned backside contact requires challenging process modules, such as placeholder formation, backside Si removal selective to a placeholder, and the like. One or more embodiments are advantageous for self-aligned direct backside contact (DBC) implementations of a BSPDN.

FIGS. 20A, 20B, and 20C are cross-sectional views of a semiconductor structure, taken along lines X, Y1, and Y2 respectively, in FIG. 14D, according to an aspect of the invention. Line "X" denotes a cross-gate view, while lines "Y1" denote along gate view and "Y2" denote cross-source/drain (S/D) views. Under the gate 243, bottom dielectric isolation (BDI) 229 is located. Under the epitaxially grown source/drain (S/D) regions 239, there is an epitaxially grown Si layer 237 (generally, a sacrificial placeholder, also referred to as Si epitaxy/epi and the first and second bottom silicon regions). The bottom surface of the epitaxially grown Si layer 237 is lower than that of the BDI 229. A backside contact 265 has an asymmetric profile, and has a bottom portion 265A (also referred to herein as a "narrow projecting gouge region") "gouging" into the epitaxially grown Si layer 237 and the S/D epitaxy 239 (also referred to herein as "epitaxially grown source/drain (S/D) regions") above. In one or more instances, the top of the STI 223 under the gate 243 is above the bottom surface of the BDI 229 (see FIG. 1B). In some cases, the top of the STI 223 under the S/D epitaxy 239 is below the bottom surface of the BDI 229 (compare FIG. 1C to FIG. 1B). In some embodiments, some backside inter-layer dielectric (ILD) 255 remains between the backside contact 265 and the BDI 229 (see FIG. 1A).

An exemplary invention process flow will now be described. In one or more embodiments, a method of forming a semiconductor structure includes forming a nanosheet stack 207, 209, 211, 213, 215, 217 (also referred to herein as "nanosheets") over a high SiGe 205 and low SiGe 203 epitaxially grown layer (see, e.g., FIG. 2A) (also referred to herein, respectively, as SiGe55 layer and low SiGe layer/SiGe30); removing the high SiGe layer (see, e.g., FIG. 6A) and forming BDI 229 (see, e.g., FIG. 7A); forming a sacrificial placeholder 237 under the S/D region within the low SiGe layer 203 (see, e.g., FIG. 9A); forming middle of line (MOL) and back end of line (BEOL) structures and bonding a carrier wafer 251 (see, e.g., FIG. 14A); flipping the wafer, and removing the substrate 201, stopping on the low SiGe layer 203 (see, e.g., FIG. 15A). The method further includes removing the low SiGe layer 203 selective to the BDI 229 and sacrificial placeholder 237 (see, e.g., FIG. 16A); forming backside ILD 255 (see, e.g., FIG. 17A); forming a backside contact opening (also referred to herein as a "trench") 257 to reveal a sacrificial placeholder 237 (see, e.g., FIGS. 18A and 18C); removing the sacrificial placeholder (see, e.g., FIGS. 19A and 19C); and forming the backside contact 265 (see, e.g., FIGS. 20A and 20C).

Referring now to FIGS. 2A-2D, note a starting structure including a silicon wafer/substrate 201. Outward of the silicon wafer 201 is a SiGe30 (30% Ge) layer 203. Outward of SiGe30 layer 203 is a SiGe55 layer 205. Outward of SiGe55 (55% Ge) layer 205 are alternating layers of SiGe30 207, 211, 215 and Si 209, 213, 217. FIGS. 2A, 2B, and 2C are views taken along lines X, Y1, and Y2 in FIG. 2D, respectively. Top view FIG. 2D shows the polycrystalline silicon dummy gates 219 (see FIGS. 4A and 4B) and the patterned nanosheets 225 (see FIGS. 3B and 3C). With regard to layer 203, note that known selective etch processes (such as wet etch processes) can remove more than 2 μm of Si thickness (i.e., change or delta in thickness), with less than 5 nm SiGe30 loss. The percentage of Ge for all the SiGe layers is exemplary. In general, layer 205 can include SiGe with the Ge % ranging from 40-75% while layers 203, 207, 211, 215 can include SiGe with the Ge % ranging from 15-35%. The skilled artisan will be familiar with the fabrication of nanosheet transistors, including preferential/selective etching of SiGe with different percentages of Ge, and, given the teachings herein, can fabricate precursor structures such as are depicted in FIGS. 2A-2C. In general, the layers 203, 207, 211, 215 have a sufficiently lower percentage of Ge than the layer 205, to permit preferential/selective etching.

Figure 3A:
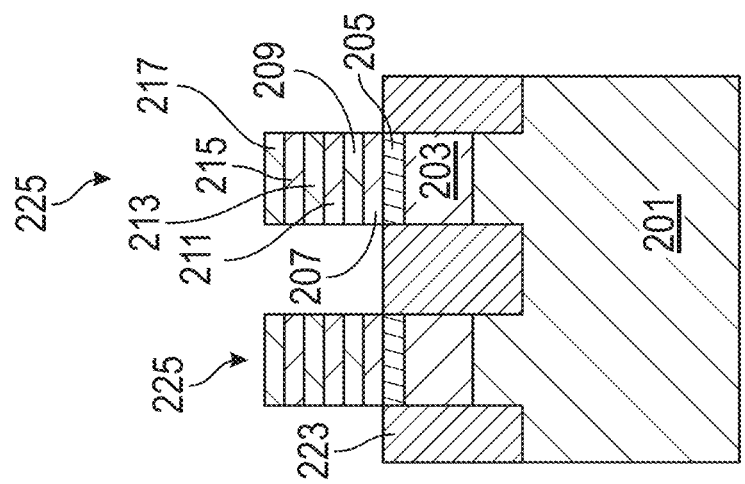
Figure 3B:
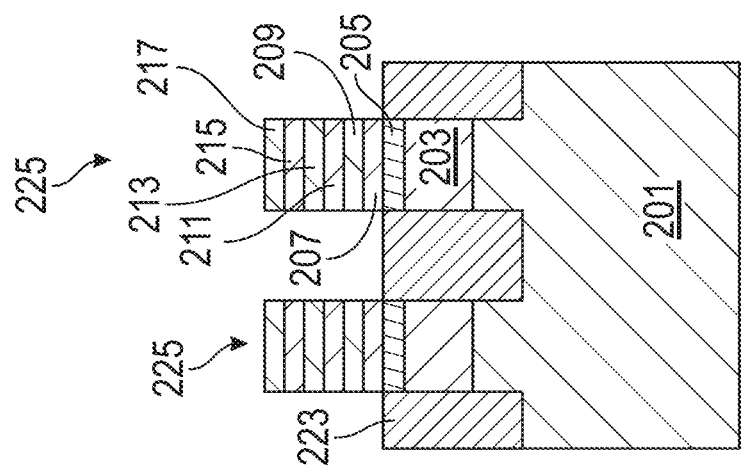
Figure 3C:
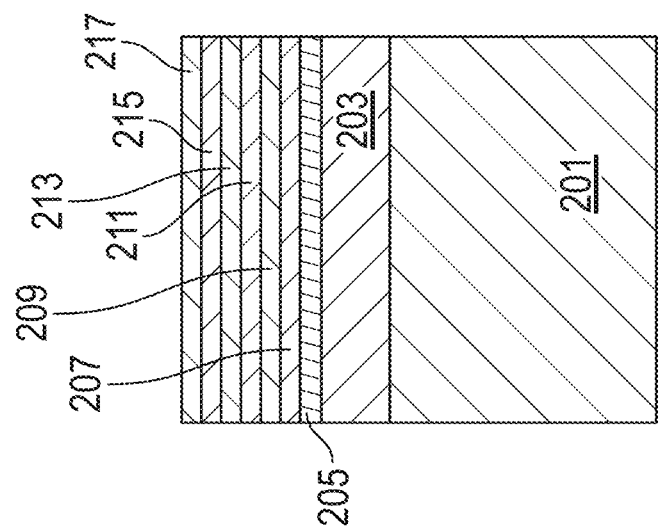

FIGS. 3A, 3B, and 3C are views taken along lines X, Y1, and Y2 in FIG. 2D, respectively, and depict the structures of FIG. 2A-2C after nanosheet (NS) patterning and shallow trench isolation (STI) formation. Note the patterned nanosheets 225 and STI 223. The skilled artisan will be familiar with the use of lithography and etching, and, given the teachings herein, can carry out the desired patterning. Suitable materials for STI 223 include, e.g., silicon oxide ($SiO_x$).

FIGS. 4A, 4B, and 4C are views taken along lines X, Y1, and Y2 in FIG. 2D, respectively, and depict the structures of FIG. 3A-3C after dummy gate formation. Note the dummy gates 219 and hard mask 227. For example, deposit amorphous Si (a-Si) material for the dummy gates 219 and carry out planarization; deposit gate hard mask material 227 (can be a multilayer dielectric); pattern the hard mask 227 and etch the a-Si to form the dummy gates 219.

FIGS. 5A, 5B, and 5C are views taken along lines X, Y1, and Y2 in FIG. 2D, respectively, and depict the structures of FIG. 4A-4C after oxide etching to reduce the height of the exposed STI (as seen in FIG. 5C) (for example, use reactive ion etching (RIE)).

Figure 6C:
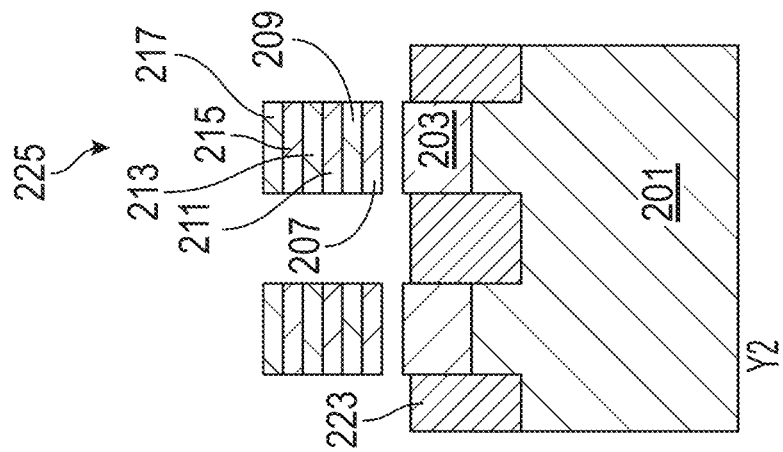
Figure 6B:
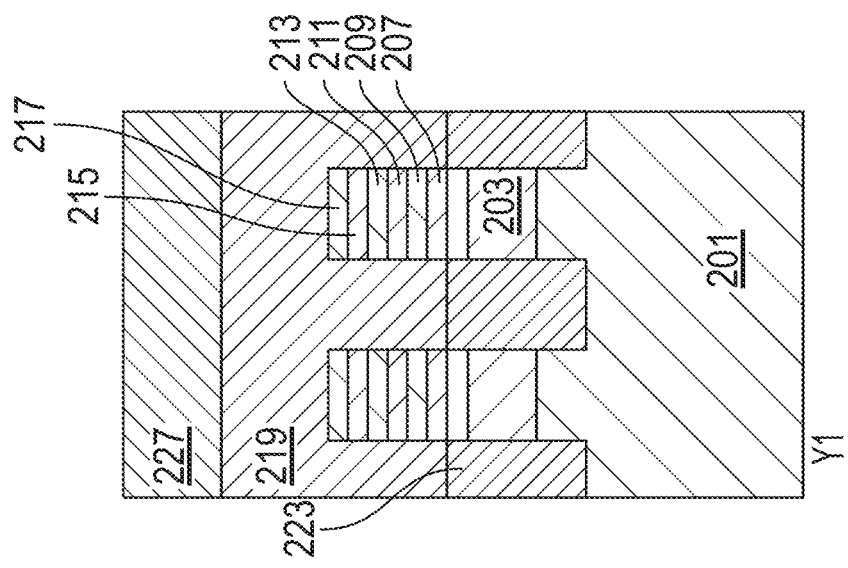
Figure 6A:
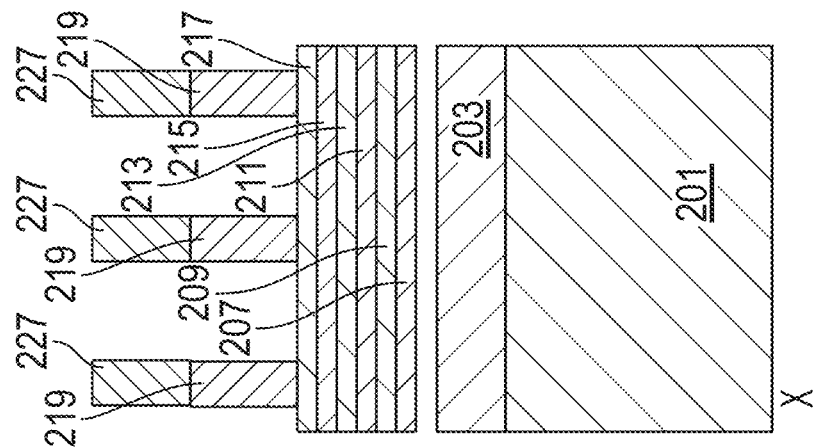

FIGS. 6A, 6B, and 6C are views taken along lines X, Y1, and Y2 in FIG. 2D, respectively, and depict the structures of FIG. 5A-5C after selective removal of the SiGe55 205. For example, carry out selective removal of the SiGe55 205 selective to SiGe30 203, 207, 211, 215; Si 201, 209, 213, 217; dummy gates 219; and hard mask 227. Use, e.g., a gas phase HCl process for this aspect. At this stage, there are no gates yet; also, the structure is not floating—all the nanosheets 207, 209, 211, 213, 215, 217 are attached to the polycrystalline silicon dummy gates 219, which is located on the STI 223, so they are stable.

Figure 7A:
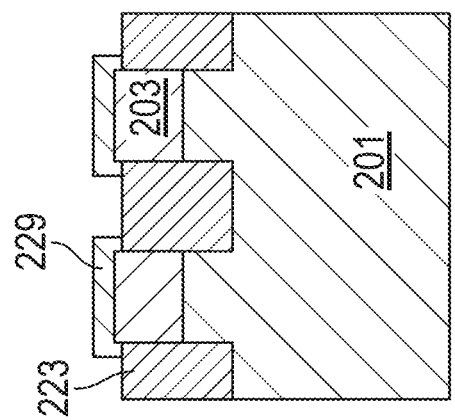
Figure 7B:
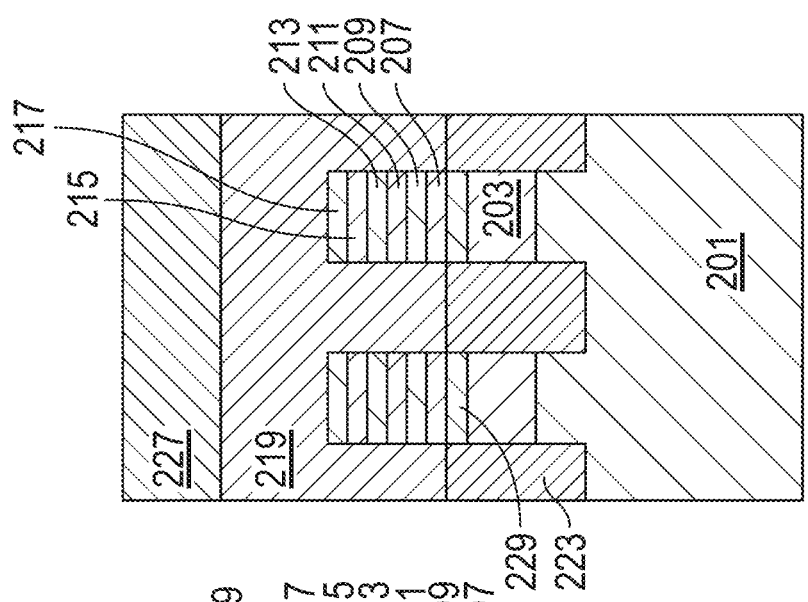
Figure 7C:
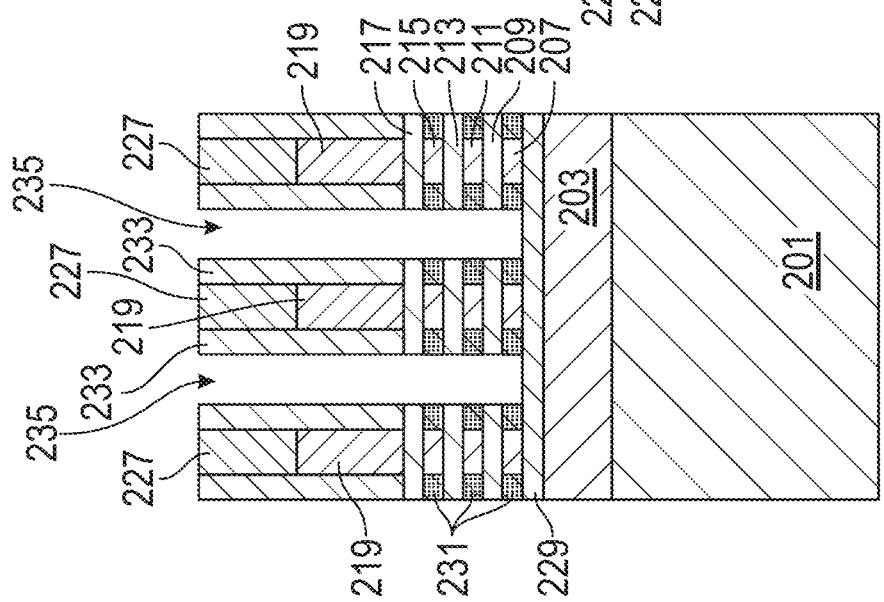

FIGS. 7A, 7B, and 7C are views taken along lines X, Y1, and Y2 in FIG. 2D, respectively, and depict the structures of FIG. 6A-6C after spacer/BDI formation, nanosheet (NS) recess, SiGe indentation, and inner spacer 231 formation. In particular, the region vacated by the selective removal of the SiGe55 205 is filled with BDI 229; the nanosheets 207, 209, 211, 213, 215, 217 are recessed; the SiGe30 layers 207, 211, 215 are indented; the inner spacer liner 231 is applied into the regions where the SiGe30 layers 207, 211, 215 were indented, and the gate spacers 233 are formed. Note the trenches 235. Note the "hatlike" shape of the BDI 229 over the SiGE30 layer 203 as seen in FIG. 7C. Non-limiting examples of suitable materials for elements 229, 231, 233 include SiBCN, SiN, SiBCN, SiOCN, SiOC, SiON, and the like. The skilled artisan, familiar with fabrication of nanosheet transistors, can process the structure shown in FIG. 6 to obtain the structure shown in FIG. 7 using known techniques, given the teachings herein. See, for example, co-assigned U.S. Pat. No. 10,903,315 of Nicolas LOUBET et al., FORMATION OF DIELECTRIC LAYER AS ETCH-STOP FOR SOURCE AND DRAIN EPITAXY DISCONNECTION.

FIGS. 8A, 8B, and 8C are views taken along lines X, Y1, and Y2 in FIG. 2D, respectively, and depict the structures of FIG. 7A-7C after etching through the trenches 235 of FIG. 7A-7C to open the BDI 229 and recess the SiGe30 203, thereby creating deeper trenches 235A. For example, employ RIE, with suitable chemistry to etch the BDI selective to elements 231, 233, and then a selective wet etch, to etch the SiGe30.

FIGS. 9A, 9B, and 9C are views taken along lines X, Y1, and Y2 in FIG. 2D, respectively, and depict the structures of FIG. 8A-8C after epitaxially growing Si 237 (either doped or undoped), from the bottom up. The skilled artisan will be familiar with techniques for epitaxially growing silicon on SiGe30, and will be familiar with techniques for doping silicon.

FIGS. 10A, 10B, and 10C are views taken along lines X, Y1, and Y2 in FIG. 2D, respectively, and depict the structures of FIG. 9A-9C after epitaxially growing source-drain regions 239 The skilled artisan will be familiar with techniques for epitaxially growing source/drain regions on epitaxially grown Si, and will be familiar with techniques for doping silicon.

FIGS. 11A, 11B, and 11C are views taken along lines X, Y1, and Y2 in FIG. 2D, respectively, and depict the structures of FIG. 10A-10C after depositing inter-layer dielectric (ILD) 241 and carrying out chemical-mechanical polishing (CMP) or suitable other planarization. A non-limiting example of a suitable material for the ILD is silicon oxide.

FIGS. 12A, 12B, and 12C are views taken along lines X, Y1, and Y2 in FIG. 2D, respectively, and depict the structures of FIG. 11A-11C after removal of the dummy gates and release of the SiGe30 layers 207, 211, 215. The skilled artisan will be familiar with removal of dummy (e.g., a-Si) gates and sacrificial SiGe layers 207, 211, 215. The Si nanosheets 209, 213, 217 are not "floating" but are anchored by the inner spacer liner 231, gate spacers 233 and S/D 239 as seen in FIG. 12A.

FIGS. 13A, 13B, and 13C are views taken along lines X, Y1, and Y2 in FIG. 13D, respectively, and depict the structures of FIG. 12A-12C after formation of high-K metal gate stacks (HKMG) 243 and formation of gate cuts 245. FIG. 13D is similar to FIG. 2D with the addition of the gate cuts 245. The skilled artisan will be familiar with the "dummy gate" process for forming HKMGs 243. The gate cuts 245 can be formed by lithography, etching, and filling. Suitable materials for the gate cuts 245 include SiN, SiO$_2$, SiBCN, SiOCN, SiOC, SiC, or combinations thereof.

FIGS. 14A, 14B, and 14C are views taken along lines X, Y1, and Y2 in FIG. 14D, respectively, and depict the structures of FIG. 13A-13C after formation of middle-of-line (MOL) contacts 247, 248; formation of back-end-of-line (BEOL) layers 249, and bonding of a carrier wafer 251. FIG. 14D is similar to FIG. 13D with the addition of the MOL contacts 247, 248. The skilled artisan will be familiar with the formation of BEOL layers including metal wiring layers, vias, and dielectric material. The skilled artisan will be familiar with the formation of MOL contacts using lithography, etching, and filling; a metal such as copper or the like is suitable. The skilled artisan will be familiar with fixtures and techniques for bonding a carrier wafer 251 (e.g., silicon, glass) to the BEOL layers 249, such as oxide-oxide bonding.

FIGS. 15A, 15B, and 15C are views taken along lines X, Y1, and Y2 in FIG. 14D, respectively, and depict the structures of FIG. 14A-14C after flipping the wafer and removing the Si substrate 201, stopping the latter (removal) operation on the STI 223 and SiGe30 203. For illustrative convenience, the structures in FIGS. 15A-15C are shown in the same orientation as in FIGS. 14A-14C, but as indicated by arrow 253, they have been "flipped" 180 degrees; i.e., in a typical process, the structures in FIGS. 14A-14C have the carrier wafer 251 located above the Si substrate 201 with respect to Earth's gravity, while the structures in FIGS. 15A-15C have the carrier wafer 251 located below the other elements with respect to Earth's gravity, even though wafer 251 is depicted at the top of the drawing views. The skilled artisan is familiar with fixtures and techniques for "flipping" wafers and for bulk removal of silicon material of substrate 201. Advantageously, at this step, all source/drain regions or gate(s) are well-protected by SiGe, which is a good etch stop layer for Si removal (this avoids any damage to S/D epitaxy or gate(s) during Si removal).

Figures 16A, 16B, 16C:
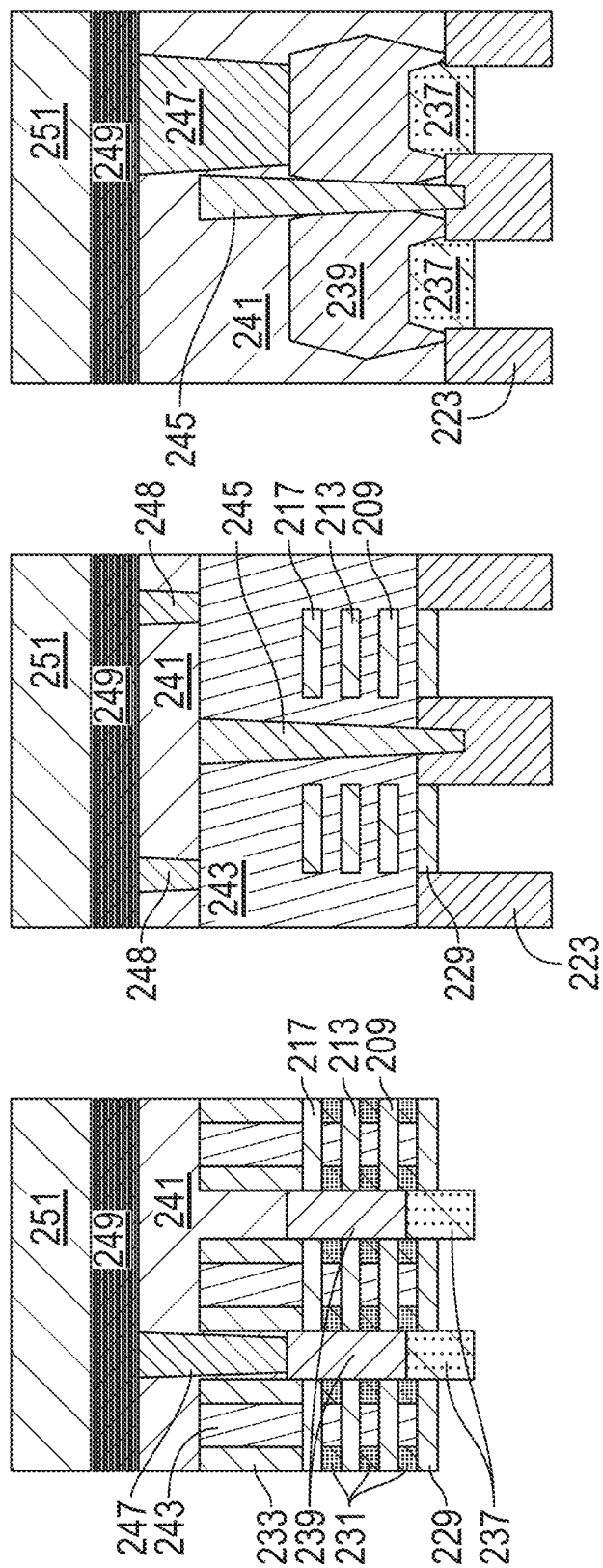

FIGS. 16A, 16B, and 16C are views taken along lines X, Y1, and Y2 in FIG. 14D, respectively, and depict the structures of FIG. 15A-15C after selective removal of the SiGe30 203 with respect to the STI 223, BDI 229, and Si epitaxy 237. Known techniques can be used for the selective removal of SiGe30 to Si.

FIGS. 17A, 17B, and 17C are views taken along lines X, Y1, and Y2 in FIG. 14D, respectively, and depict the structures of FIG. 16A-16C after deposition of backside ILD (BILD) 255 and planarization such as CMP. A non-limiting example of a suitable material for the BILD is silicon oxide.

Figures 18A, 18B, 18C:
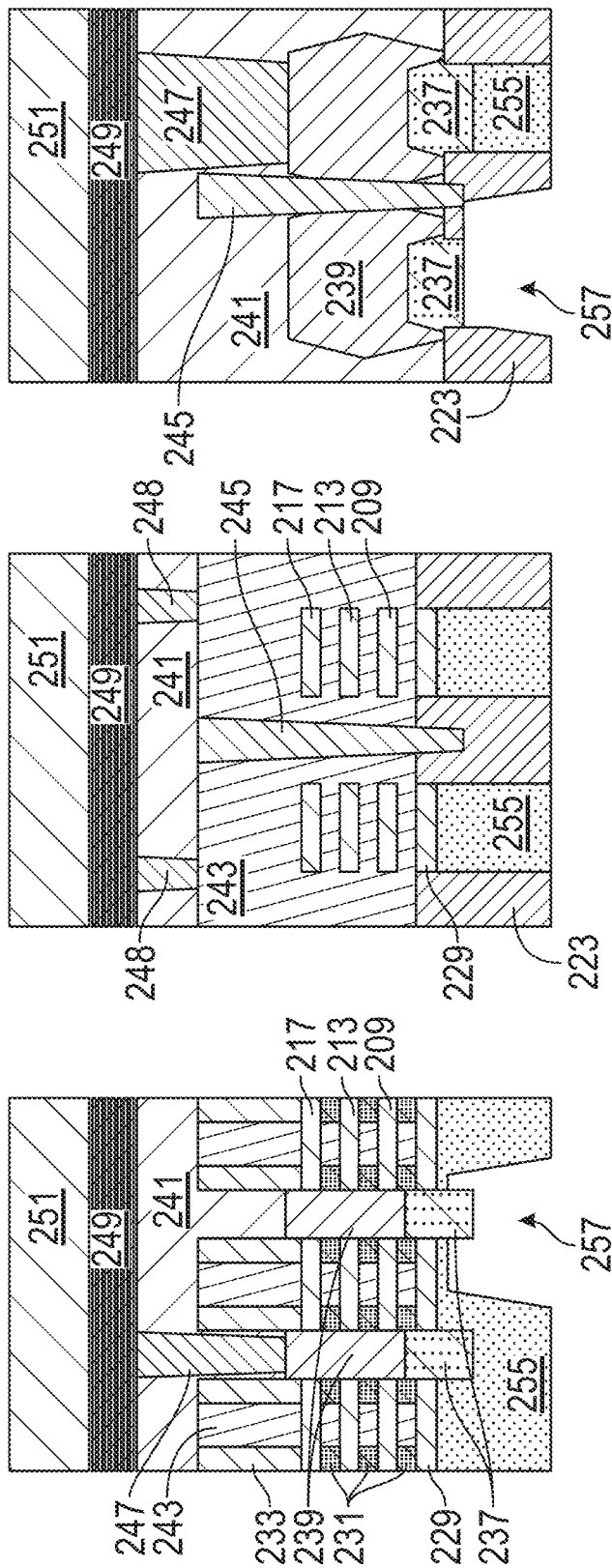

FIGS. 18A, 18B, and 18C are views taken along lines X, Y1, and Y2 in FIG. 14D, respectively, and depict the structures of FIG. 17A-17C after backside contact patterning, wherein trench 257 is formed in BILD 255 and STI 223. This can be done, for example, using suitable lithography and etching, such as reactive ion etching (RIE). Advantageously, the critical dimension (e.g., diameter) of the backside contact to be formed in trench 257 can be large (e.g., larger than the bottom dimension of the Si epitaxy 237—in a non-limiting example, the size of the backside contact can be about half the gate pitch). In one or more embodiments, as long as the overlay is less than 15 nm, the backside contacts to be formed in trench 257 will not short to the neighboring Si epitaxy 237. Furthermore in this regard, lithography overlay is the ability of a lithography system to print accurate features on each layer exactly where they are supposed to be. In one or more embodiments, as long as trench 257 trench does not open to the neighboring Si epi and therefore create a short between neighboring FETs, it should be acceptable. Furthermore, in one or more embodiments, the backside contact RIE does not need to go deep to reach the BDI 229, which can be weak as a contact etch stop.

FIGS. 19A, 19B, and 19C are views taken along lines X, Y1, and Y2 in FIG. 14D, respectively, and depict the structures of FIG. 18A-18C after optionally recessing the Si epi 237 adjacent trench 257 (for example, if the same is not heavily doped) to form additional recesses 261, 263 within trench 257. A suitable process includes, for example, Si wet etching. This recess process can enlarge the silicide area (i.e., area of the trench 257 to be lined with a silicide prior to the contact formation). It should be noted that without this optional recessing step, the "gouge" will not be created. However, even without the "gouge," advantageously, the backside contact critical dimension (CD) is enlarged and the backside contact does not touch the BDI.

FIGS. 20A, 20B, and 20C are views taken along lines X, Y1, and Y2 in FIG. 14D, respectively, and depict the structures of FIG. 19A-19C after backside contact metallization to form backside contact 265. In one or more embodiments, the contact 265 includes a silicide liner, such as Ti, Nit, NiPt, etc.; a thin metal adhesion liner, such as TiN; and low resistance metal fill, such as W, Co, Ru, etc.

FIGS. 1A, 1B, and 1C are views taken along lines X, Y1, and Y2 in FIG. 14D, respectively, and depict the structures of FIG. 20A-20C after forming the BSPDN layers 267. In one or more embodiments, the BSPDN layers 267 include more than one layer of metal lines and vias in between. The metal lines and vias are filled with metals such as Co, Cu, Al, etc., with adhesion liners such as TaN, or TiN. The skilled artisan will be familiar with the formation of BSPDN layers including metal wiring layers, vias, and dielectric material.

In a non-limiting example, conductive/metal features can include a silicide liner, such as Ni, Ti, NiPt, etc.; a thin metal adhesion layer, such as TiN or TaN; and conductive metal fill, such as Ru, W, Co, or Cu. Suitable materials for STI liners herein include, e.g., SiCO, SiOCN and silicon nitride (SiN). Suitable materials for STI herein include, e.g., silicon oxide (SiOx); STI can be deposited, for example, via High Density Plasma (HDP) deposition, Chemical Vapor Deposition (CVD), etc.

Referring, for example, to FIG. 1A, a field effect transistor (FET) includes a first source-drain region (leftmost 239), a second source-drain region (right-most 239), one or more channel regions (e.g., the Si nanosheets 209, 213, 217), and a gate 243 around the channel regions. The FET can be a nanosheet FET and can be n-type (with n-type S/D regions) or p-type (with p-type S/D regions). An array of FETS can be provided; for example, with both n-type and p-type (complementary metal-oxide semiconductor or CMOS).

For clarity, note that each source/drain region 239 shown in FIG. 1C corresponds to a different device running in the perpendicular direction (into and out of the page). Thus, aspects of the invention include a semiconductor array structure including a plurality of field effect transistors; for example, arranged in rows. In a non-limiting example, as discussed just above, a CMOS array is provided with n-type and p-type FETS adjacent to each other. Inverters or other types of CMOS logic gates can be formed. The skilled artisan will be familiar with CMOS inverters and other CMOS logic gates. In such an inverter, a pFET has a source connected to power rail VDD, and a drain connected to the drain of an nFET. The source of the nFET is connected to ground/VS S. The gates of the nFET and pFET are coupled and form an input that receives a signal. The coupled drains of the nFET and pFET form the output node. One or more embodiments further include a signal source coupled to the front side wiring network and a power supply coupled to the back side power distribution network. By way of a non-limiting specific example, referring to FIG. 21, in one or more embodiments, the array structure further includes a first signal source (e.g., clock signal 2406); a logic signal source 2408; and a power supply (e.g., power supply 2402 (VDD) and ground terminal 2404 (VSS)). Element 2400 generally represents an individual device or an array of devices, according to any of the disclosed embodiments. Power connections are generally provided to source/drain terminals through suitable contact structures, while signal connections are generally provided to gates through suitable contact structures. Power could be provided, for example, from the BSPDN layers 267. Signals could be provided, for example, from front side wiring network 249, which could also include power wiring. VDD refers, for example, to the power supply pin connected to PFETs while VSS refers, for example, to the power supply pin connected to NFETs.

In one or more embodiments, the front side metal features are tapered with a larger cross section towards the front side while the back side metal features are tapered with a larger cross section towards the back side.

As noted, in one or more embodiments, with the Si epi layer 237, the backside contact CD can be large, and as long as the overlay is less than 15 nm, it will not short to the neighboring Si epi. In addition, the RIE to form the backside contact does not need to go deep to reach the BDI 229, which can be weak as a contact etch stop. Advantageously, the BDI 229 is provided to enhance the operation of the semiconductor by reducing sub-channel leakage and increasing power performance. Furthermore, with the SiGe layer 203 below the NS and SiGe 55 layers, the backside Si substrate removal process can be better controlled with less potential damage to the S/D and gate if the BDI has a pin hole. Indeed, the SiGe layer 203 under BDI 229 serves as a buffer layer during Si substrate removal to avoid potential damage to the S/D and gate if there is a pin hole at the BDI. Advantageously, the gouging backside contact profile can enlarge the silicide area.

Given the discussion thus far, and referring to FIGS. 1A-1C, it will be appreciated that in one aspect, an exemplary semiconductor structure includes a first source-drain region (leftmost 239), a second source-drain region (right-most 239), and at least one channel region 209, 213, 217 coupling the first and second source-drain regions. Also included are a gate 243 adjacent the at least one channel region, a bottom dielectric isolation region 229 inward of the gate, and first and second bottom silicon regions 237 respectively located inward of the first and second source-drain regions. The structure further includes a back side contact 265 projecting through the second bottom silicon region into the second source-drain region.

In one or more embodiments, the back side contact 265 has an asymmetric profile when viewed in cross-section (FIGS. 1A and 1C).

In one or more embodiments, the semiconductor structure further includes a back side power distribution network 267 inward of the back side contact. The back side contact is connected to the back side power distribution network.

In at least some cases, the semiconductor structure further includes a front side wiring network 249, on a front side of the semiconductor structure (which can be formed, for example, using BEOL processes and thus has the same reference character as the BEOL layers), and a contact 247 interconnecting the front side wiring network and the first source-drain region.

In one or more embodiments, the bottom surface of the Si epi layer 237 is lower than the BDI 229. Stated differently, an inmost surface of each of the first and second bottom silicon regions extends further inward than an inmost surface of the bottom dielectric isolation region.

Note that "inward," in context, means towards the bottom of the view and "outward" means towards the top of the view.

One or more embodiments further include a shallow trench isolation region 223 inward of the gate and the first and second source-drain regions. In at least some cases, the STI height under the gate 243 is above the bottom surface of the BDI 229. Stated differently, an outermost surface of the shallow trench isolation region 223, inward of the gate 243, extends further outward than the inmost surface of the bottom dielectric isolation region.

In at least some cases, the STI height under the S/D epi is below the bottom surface of the BDI. Stated differently, an outermost surface of the shallow trench isolation region 223, inward of the first and second source-drain regions 239, is further inward than the inmost surface of the bottom dielectric isolation region 229.

In one or more embodiments, some backside ILD 255 remains between the backside contact and the BDI. One or more embodiments further include the back side inter-layer dielectric 255 region inward of the bottom dielectric isolation region 229. The back side contact, in one or more embodiments, has an inmost wide region and a narrow projecting gouge region 265A that projects through the second bottom silicon region into the second source-drain region. A portion of the back side inter-layer dielectric region 255 is located between an outmost surface of the inmost wide region and the inmost surface of the bottom dielectric isolation region, as best seen in FIG. 1A. The gouge region is offset from a center line of the inmost wide region when viewed in cross section, as seen in FIGS. 1A and 1C.

In some cases, the first and second bottom silicon regions 237 extend inwardly into the back side inter-layer dielectric region 255.

The gate 243 can be, for example, a gate-all-around high-K metal gate surrounding the at least one channel region formed by the nanosheets 209, 213, 217 (the channel region functions as a conductive channel when the gate is energized).

In one or more embodiments, the back side contact 265 does not touch the bottom dielectric isolation region 229.

In one or more embodiments, the back side contact 265 has a maximum diameter greater than a maximum diameter of the second bottom silicon region 237.

Figure 21:
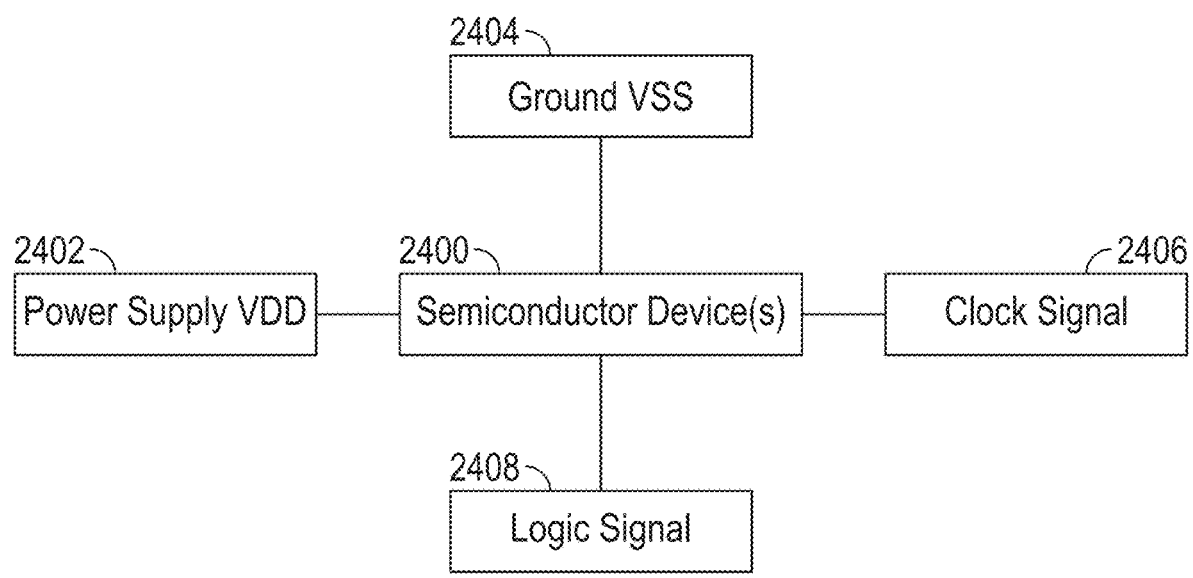
FIG. 21 shows exemplary signal and power connections, in accordance with aspects of the invention.

In another aspect, an exemplary semiconductor array structure includes a plurality of field effect transistors, each including a first source-drain region, a second source-drain region, at least one channel region coupling the first and second source-drain regions, a gate adjacent the at least one channel, a bottom dielectric isolation region inward of the gate, and first and second bottom silicon regions respectively located inward of the first and second source-drain regions, as just described. The plurality of field effect transistors are, for example, arranged in rows, and the array further includes a back side power distribution network 267; a front side wiring network 249; a plurality of contacts 247 interconnecting the front side wiring network and the plurality of first source-drain regions; and a plurality of back side contacts 265, each projecting through a corresponding one of the second bottom silicon regions 237 into a corresponding one of the second source-drain regions 239, each connected to the back side power distribution network 267. One or more embodiments further include a signal source coupled to the front side wiring network and a power supply coupled to the back side power distribution network. Refer to FIG. 21.

In one or more embodiments, each back side contact has an asymmetric profile when viewed in cross-section.

In one or more embodiments, the plurality of back side contacts 265 do not touch the bottom dielectric isolation region 229 and/or the plurality of back side contacts 265 each have a maximum diameter greater than a maximum diameter of the second bottom silicon region 237.

In one or more embodiments, a maximum diameter of the plurality of back side contacts is about half the distance between adjacent ones of the gates (as noted above, the size of the backside contact can be about half the gate pitch).

In another aspect, an exemplary method of forming a semiconductor structure includes providing a precursor structure including a nanosheet stack 207, 209, 211, 213, 215, 217 outward of a high SiGe epitaxially grown layer 205 and a low SiGe epitaxially grown layer 203 on an underlying substrate 201 (see, e.g., FIG. 2A). A further step includes removing the high SiGe layer (see, e.g., FIG. 6A) and forming bottom dielectric isolation (BDI) 229 in a region vacated by the high SiGe layer (see, e.g., FIG. 7A). Yet a further step includes forming two sacrificial placeholders 237 at least partially within the low SiGe epitaxially grown layer 203 and forming source-drain regions 239 outward of the two sacrificial placeholders 237 (see, e.g., FIGS. 9A and 10A).

An even further step includes forming middle of line (MOL) (e.g., 247) and back end of line (BEOL) structures 249 outward of the precursor structure and bonding a carrier wafer 251 outward of the (BEOL) structures (see, e.g., FIG. 14A). Referring to FIGS. 15A-15C, the carrier wafer is flipped, and the substrate 201 is removed, stopping on the low SiGe layer 203. The low SiGe layer 203 is removed selective to the BDI 229 and sacrificial placeholder 237 (see, e.g., FIG. 16A). Form backside inter-layer dielectric (ILD) 255 (see, e.g., FIG. 17A) inward of the BDI 229.

Still a further step includes forming a backside contact opening 257 in at least the backside ILD to reveal one of the sacrificial placeholders 237 (see, e.g., FIGS. 18A and 18C). Optionally, remove at least a portion of the revealed one of the sacrificial placeholders (see, e.g., FIGS. 19A and 19C). Form the backside contact 265 (see, e.g., FIGS. 20A and 20C) within the backside contact opening.

In one or more embodiments, in the step of forming the backside contact openings and the step of removing the at least portion of the revealed one of the sacrificial placeholders, a centerline of the at least portion of the revealed one of the sacrificial placeholders is offset from a centerline of the backside contact openings. See FIGS. 1A and 1C.

One or more embodiments further include forming gates 243 between the source-drain regions surrounding channel portions of the nanosheet stacks. See FIGS. 13A-13C.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. For example, the skilled artisan will be familiar with epitaxial growth, self-aligned contact formation, formation of high-K metal gates, and so on. The term "high-K" has a definite meaning to the skilled artisan in the context of high-K metal gate (HKMG) stacks, and is not a mere relative term. Moreover, one or more of the processing steps and tooling used to fabricate semiconductor devices are also described in a number of readily available publications, including, for example: James D. Plummer et al., Silicon VLSI Technology: Fundamentals, Practice, and Modeling P t Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. However, in FIGS. 1A, 1B, and 1C, for example, the relative heights/thicknesses of the various layers are representative across the figures. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Those skilled in the art will appreciate that the exemplary structures discussed above can be distributed in raw form (i.e., a single wafer having multiple unpackaged chips), as bare dies, in packaged form, or incorporated as parts of intermediate products or end products.

An integrated circuit in accordance with aspects of the present inventions can be employed in essentially any application and/or electronic system. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A semiconductor structure comprising:
    a first source-drain region;
    a second source-drain region;
    at least one channel region coupling the first and second source-drain regions;
    a gate adjacent the at least one channel region;
    first and second bottom silicon regions respectively located inward of the first and second source-drain regions;
    a back side inter-layer dielectric region inward of the gate;
    a bottom dielectric isolation region inward of the gate and outward of the back side inter-layer dielectric region, wherein the gate and the back side interlayer dielectric region are on opposite sides of the bottom dielectric isolation region and the bottom dielectric isolation region is:
        sandwiched between and separates the at least one channel region and gate from the back side inter-layer dielectric region; and
        between and separates the first bottom silicon region from the second bottom silicon region; and
    a back side contact projecting through the second bottom silicon region into the second source-drain region, wherein the back side inter-layer dielectric region and the second bottom silicon region are located between and separate the back side contact from the bottom dielectric isolation region such that the back side contact does not touch the bottom dielectric isolation region.

2. The semiconductor structure of claim 1, wherein the back side contact has an asymmetric profile when viewed in cross-section.

3. The semiconductor structure of claim 2, further comprising a back side power distribution network inward of the back side contact, the back side contact being connected to the back side power distribution network.

4. The semiconductor structure of claim 3, further comprising:
    a front side wiring network, on a front side of the semiconductor structure; and
    a contact interconnecting the front side wiring network and the first source-drain region.

5. The semiconductor structure of claim 4, wherein an inward most surface of each of the first and second bottom silicon regions extends further inward than an inward most surface of the bottom dielectric isolation region.

6. The semiconductor structure of claim 5, further comprising a shallow trench isolation region inward of the gate and the first and second source-drain regions, wherein an outward most surface of the shallow trench isolation region, inward of the gate, extends further outward than the inward most surface of the bottom dielectric isolation region.

7. The semiconductor structure of claim 5, further comprising a shallow trench isolation region inward of the gate and the first and second source-drain regions, wherein an outward most surface of the shallow trench isolation region, inward of the first and second source-drain regions, is further inward than the inward most surface of the bottom dielectric isolation region.

8. The semiconductor structure of claim 5, wherein:
    the back side contact has a wide region and a narrow projecting gouge region outward of the wide region that projects through the second bottom silicon region into the second source-drain region;
    a portion of the back side inter-layer dielectric region is located between an outward most surface of the wide region and the inward most surface of the bottom dielectric isolation region; and
    the narrow projecting gouge region is offset from a center line of the wide region when viewed in cross section.

9. The semiconductor structure of claim 8, wherein the first and second bottom silicon regions extend inwardly into the back side inter-layer dielectric region.

10. The semiconductor structure of claim 5, wherein the gate comprises a gate-all-around high-K metal gate surrounding the at least one channel region.

11. The semiconductor structure of claim 1, wherein the back side contact has a maximum diameter greater than a maximum diameter of the second bottom silicon region.

12. A semiconductor array structure comprising:
    a plurality of field effect transistors, each comprising a first source-drain region, a second source-drain region, at least one channel region coupling the first and second source-drain regions, a gate adjacent the at least one channel, a back side inter-layer dielectric region inward of the gate, a bottom dielectric isolation region inward of the gate and outward of the back side interlayer dielectric region, and first and second bottom silicon regions respectively located inward of the first and second source-drain regions, wherein the bottom dielectric isolation region:
        is sandwiched between and separates the at least one channel region and gate located on one side of the bottom dielectric isolation region from the back side inter-layer dielectric region located on an opposite side of the bottom dielectric isolation region; and
        resides between and separates the first bottom silicon region from the second bottom silicon region;
    a back side power distribution network;
    a front side wiring network;
    a plurality of contacts interconnecting the front side wiring network and the plurality of first source-drain regions; and
    a plurality of back side contacts, each projecting through a corresponding one of the second bottom silicon regions into a corresponding one of the second source-drain regions, each connected to the back side power distribution network, wherein:

the back side inter-layer dielectric region and the corresponding second bottom silicon regions are located between and separate the plurality of back side contacts from the bottom dielectric isolation region such that the plurality of back side contacts do not touch the bottom dielectric isolation region.

13. The semiconductor array structure of claim 12, wherein each back side contact has an asymmetric profile when viewed in cross-section.

14. The semiconductor array structure of claim 12, wherein;

the plurality of back side contacts each have a maximum diameter greater than a maximum diameter of the second bottom silicon regions.

15. The semiconductor array structure of claim 12, wherein a maximum diameter of the plurality of back side contacts is half the distance between adjacent ones of the gates.

16. The semiconductor array structure of claim 12, further comprising:

a signal source coupled to the front side wiring network; and a power supply coupled to the back side power distribution network.

17. The semiconductor structure of claim 1, wherein the back side contact has a narrow projecting gouge region that projects through the second bottom silicon region into the second source-drain region further outward than at least a portion of the one channel region.

* * * * *